(12) United States Patent
Lee et al.

(10) Patent No.: US 12,402,257 B2
(45) Date of Patent: Aug. 26, 2025

(54) DISPLAY DEVICE AND METHOD OF MANUFACTURING THE SAME

(71) Applicant: Samsung Display Co., LTD., Yongin-si (KR)

(72) Inventors: Sang Duk Lee, Yongin-si (KR); Mi Sun Kim, Hwaseong-si (KR); Min Soo Kim, Seoul (KR); Yoon A Kim, Hwaseong-si (KR); Chan Jae Park, Suwon-si (KR); Sun Ok Oh, Hwaseong-si (KR); Ki Kyung Youk, Bucheon-si (KR); Hyun A. Lee, Seoul (KR); Chel Gou Lim, Suwon-si (KR); Soo Yeon Han, Gwacheon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 787 days.

(21) Appl. No.: 17/566,545

(22) Filed: Dec. 30, 2021

(65) Prior Publication Data
US 2022/0208941 A1 Jun. 30, 2022

(30) Foreign Application Priority Data
Dec. 31, 2020 (KR) .......................... 10-2020-0188904

(51) Int. Cl.
*H05K 3/36* (2006.01)
*H10K 59/12* (2023.01)
*H10K 59/131* (2023.01)
*H10K 71/00* (2023.01)

(52) U.S. Cl.
CPC ............ *H05K 3/361* (2013.01); *H10K 71/00* (2023.02); *H10K 59/1201* (2023.02); *H10K 59/131* (2023.02)

(58) Field of Classification Search
CPC .............. H10K 59/131; H10K 59/129; H10K 59/1201; H10K 71/00; H01L 24/10; H01L 24/13; H01L 24/16; H01L 24/75; H01L 24/81; H05K 3/321; H05K 3/361; H05K 2203/105; H05K 2201/0221
USPC .......................................................... 257/40
See application file for complete search history.

(56) References Cited

U.S. PATENT DOCUMENTS

2017/0271299 A1* 9/2017 Li ........................... H01L 24/83
2021/0375804 A1* 12/2021 Kang ..................... H05K 3/323

FOREIGN PATENT DOCUMENTS

CN 105493204 4/2016
KR 1020170130675 11/2017

* cited by examiner

*Primary Examiner* — Fazli Erdem
(74) *Attorney, Agent, or Firm* — CANTOR COLBURN LLP

(57) ABSTRACT

A display device includes a display panel including a plurality of pad electrodes, a driving member attached to the display panel and including a plurality of bumps facing the plurality of pad electrodes, respectively, a plurality of conductive particles interposed between the display panel and the driving member, and a plurality of alignment electrodes separated from the plurality of pad electrodes and the plurality of bumps, where an opening is defined in at least one of a pad electrode of the plurality of pad electrodes and a bump of the plurality of bumps includes an opening, and an alignment electrode of the plurality of alignment electrodes is disposed in the opening.

20 Claims, 22 Drawing Sheets

DISPLAY DEVICE AND METHOD OF MANUFACTURING THE SAME

This application claims priority to Korean Patent Application No. 10-2020-0188904, filed on Dec. 31, 2020, and all the benefits accruing therefrom under 35 U.S.C. § 119, the content of which in its entirety is herein incorporated by reference.

BACKGROUND

1. Field

Embodiments of the invention relate to a display device and a method of manufacturing the display device.

2. Description of the Related Art

An importance of display devices is increasing with a development of multimedia. Accordingly, various types of display devices, such as a liquid crystal display ("LCD") device, an organic light emitting display ("OLED") device, and the like have been used.

A small semiconductor chip referred to as a display driver integrated circuit ("IC") may be used to drive a display panel of the above-described display device. The display driver IC may be attached to a substrate of the display panel by a method such as a chip on glass ("COG") method, a chip on film ("COF") method, a chip on plastic ("COP") method, or the like.

The COF method is a method of attaching a thin flexible film on which the display driver IC is mounted to the substrate of the display panel. Conductive particles can be interposed between the display panel and the flexible film to electrically connect the display panel and the flexible film.

SUMMARY

A feature of the invention provides a display device capable of preventing a connection failure due to a flow of conductive particles.

Another feature of the invention provides a method of manufacturing the display device.

The invention are not limited to the above-mentioned features, and other features which are not mentioned may be apparently understood from the following descriptions by those skilled in the art.

An embodiment of a display device includes a display panel including a plurality of pad electrodes, a driving member attached to the display panel and including a plurality of bumps facing the plurality of pad electrodes, respectively, a plurality of conductive particles interposed between the display panel and the driving member, and a plurality of alignment electrodes separated from the plurality of pad electrodes and the plurality of bumps, where an opening is defined in at least one of a pad electrode of the plurality of pad electrodes and a bump of the plurality of bumps, and an alignment electrode of the plurality of alignment electrodes is disposed in the opening.

An embodiment of a display device includes a display panel including a plurality of pad electrodes, a printed circuit board attached to the display panel and including a plurality of lead electrodes facing the plurality of pad electrodes, respectively, a plurality of conductive particles interposed between the display panel and the printed circuit board, and a plurality of alignment electrodes separated from the plurality of pad electrodes and the plurality of lead electrodes, where an opening is defined in at least one of a pad electrode of the plurality of pad electrodes and the lead electrode, and an alignment electrode of the plurality of alignment electrodes is disposed in the opening.

An embodiment of a method of manufacturing a display device includes applying a resin in which a plurality of conductive particles is dispersed onto a substrate of a display panel on which a plurality of pad electrodes are disposed, arranging a plurality of bumps of a driving member to face the plurality of pad electrodes, respectively, applying an electric field to the plurality of conductive particles and aligning the plurality of conductive particles, and bonding the display panel and the driving member.

Details of other embodiments are included in the detailed description and drawings.

BRIEF DESCRIPTION OF THE DRAWINGS

The above and other features and features of the invention will become more apparent by describing in detail embodiments thereof with reference to the attached drawings, in which.

DETAILED DESCRIPTION

Figure 1:
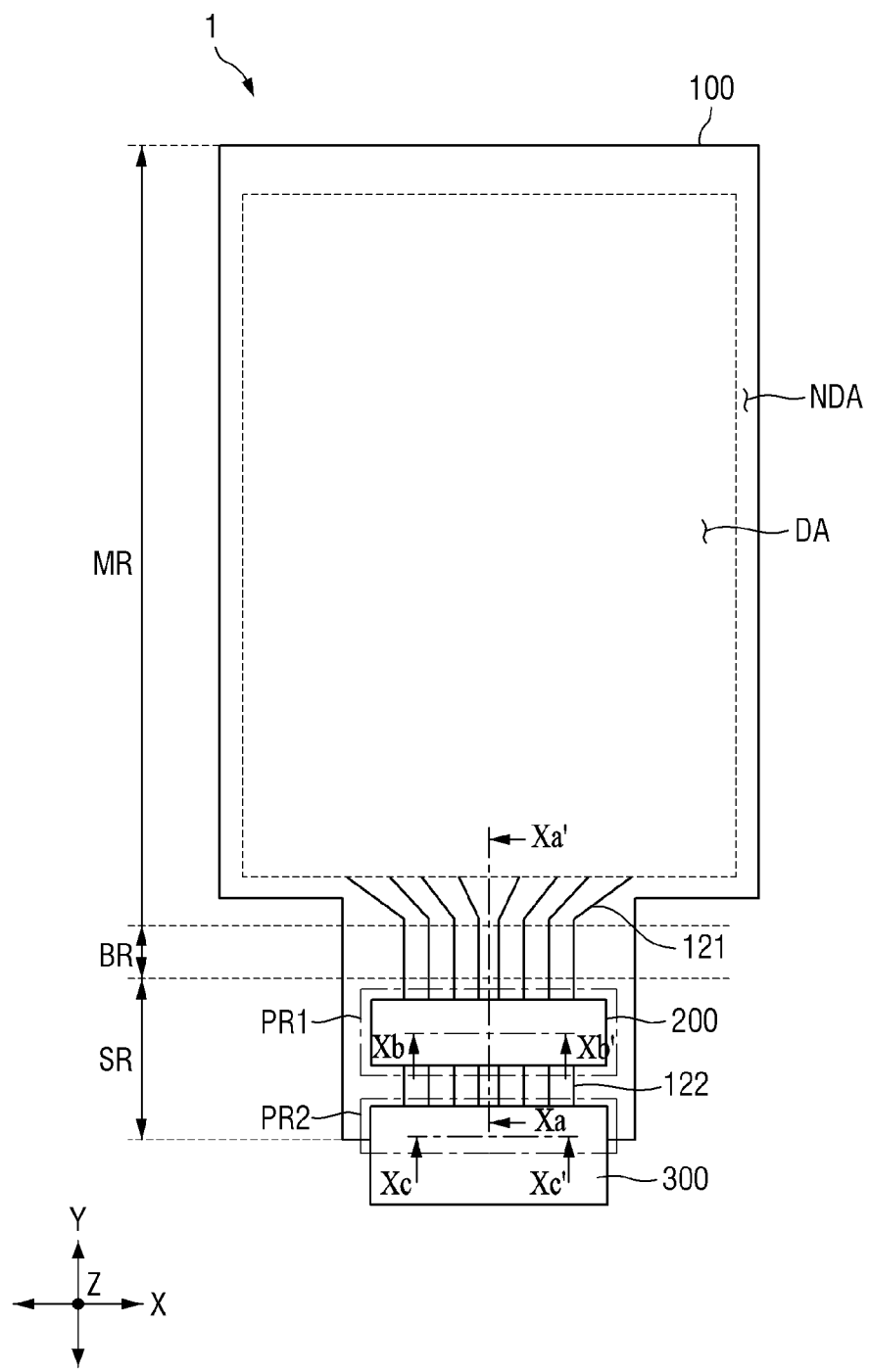
FIG. 1 is a plan view of an embodiment of a display device.

Features of the present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art. The same reference numbers indicate the same components throughout the specification. In the attached drawing figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Hereinafter, embodiments will be described with reference to the accompanying drawings.

Figure 2:
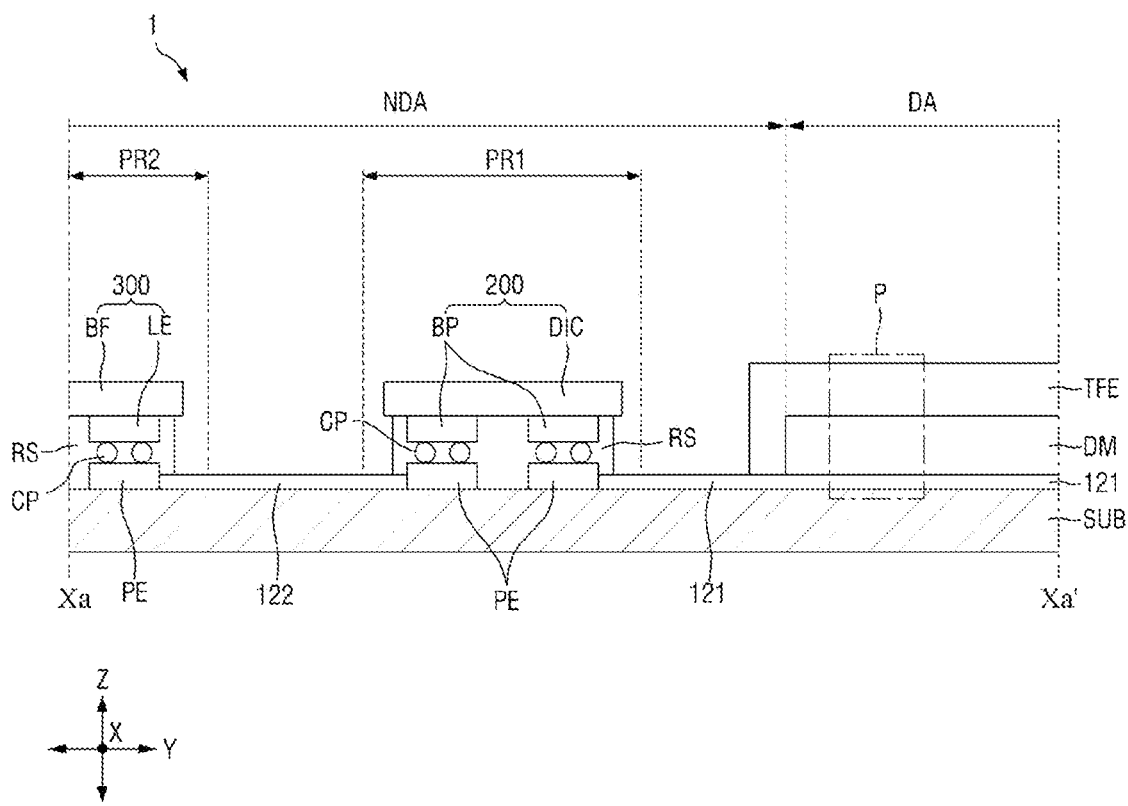
FIG. 2 is a cross-sectional view taken along line Xa-Xa' in FIG. 1.
Figure 3:
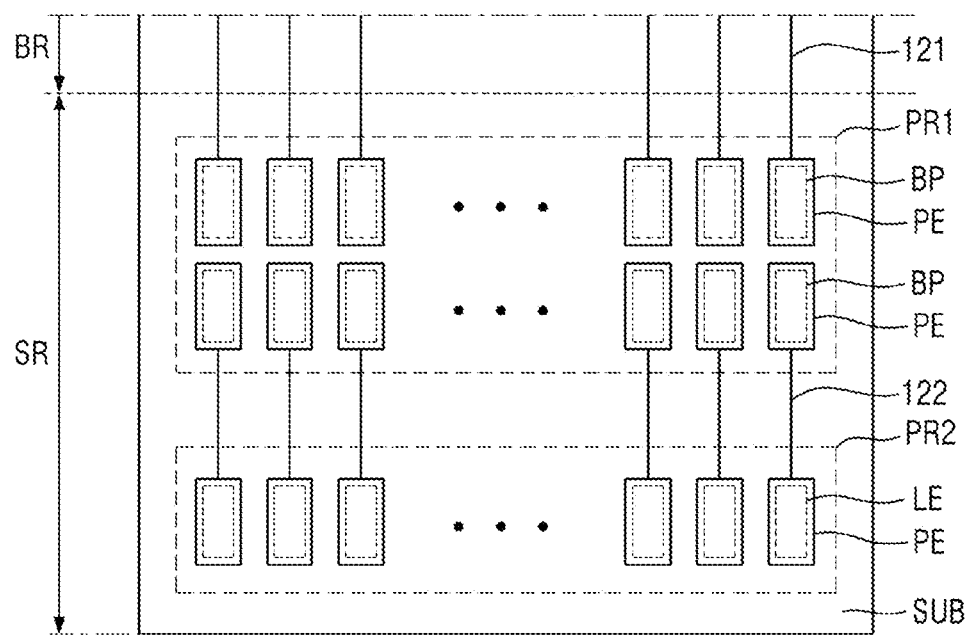
FIG. 3 is a plan view of a sub region in FIG. 1.
Figure 4:
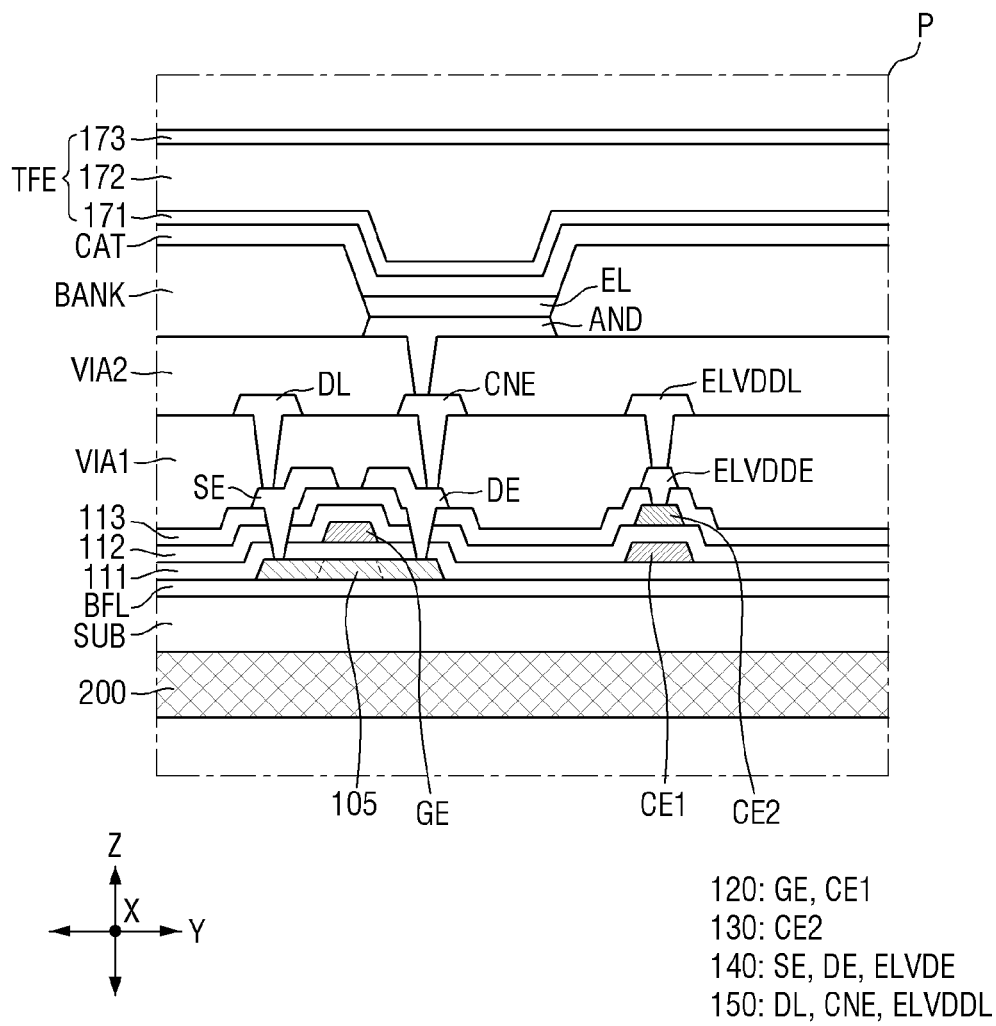
FIG. 4 is an enlarged cross-sectional view of portion P in FIG. 2.

FIG. 1 is a plan view of an embodiment of a display device. FIG. 2 is a cross-sectional view taken along line Xa-Xa' in FIG. 1. FIG. 3 is a plan view of a sub region in FIG. 1. FIG. 4 is an enlarged cross-sectional view of portion P in FIG. 2.

Hereinafter, a first direction X, a second direction Y, and a third direction Z intersect in different directions. The first direction X, the second direction Y, and the third direction Z may perpendicularly intersect. In an embodiment, the first direction X may be a horizontal direction, the second direction Y may be a vertical direction, and the third direction Z may be a thickness direction, for example. The first direction X, the second direction Y, and/or the third direction Z may include two or more directions. In an embodiment, in a cross-sectional view, the third direction Z may include an upward direction and a downward direction, for example. In this case, one surface of a member disposed to face upward may be referred to as an upper surface, and the other surface of the member disposed to face downward may be referred to as a lower surface. However, the directions are exemplary and relative, and are not limited to the above.

A display device 1 is a device that displays videos or still images, and the display device 1 may include not only portable electronic devices such as a mobile phone, a smart phone, a tablet personal computer ("PC"), a smart watch, a watch phone, a mobile communication terminal, an electronic notebook, and an e-book reader, a portable multimedia player ("PMP"), a navigation device, an ultra-mobile PC ("UMPC"), and the like but also various products such as a television, a notebook computer, a monitor, a billboard, an Internet of Things device, and the like.

Referring to FIG. 1, the display device 1 may include a display panel 100 which displays an image, a printed circuit board 300 connected to the display panel 100, and a main circuit board 500 (refer to FIG. 14) connected to the printed circuit board 300.

As the display panel 100, for example, an organic light emitting display panel 100 may be applied. Hereinafter, the organic light emitting display panel is exemplified as the display panel 100 but is not limited thereto. In an embodiment, different types of display panels such as a liquid crystal display ("LCD") panel, a quantum dot organic light emitting display ("QD-OLED") panel, a quantum dot liquid crystal display ("QD-LCD") panel, a quantum nano light emitting display ("Nano NED") panel, a micro-LED panel, and the like may be applied as the display panel 100, for example.

The display panel 100 includes a display region DA including a plurality of pixel regions, and a non-display region NDA disposed around the display region DA.

The display region DA may have a quadrangular (e.g., rectangular) shape with right-angled corners or a quadrangular (e.g., rectangular) shape with round corners in a plan view. The display region DA may have short sides and long sides. The short side of the display region DA may be a side extending in the first direction X. The long side of the display region DA may be a side extending in the second direction Y. However, a planar shape of the display region DA is not limited to the quadrangular (e.g., rectangular) shape and may be a circular shape, an oval shape, or various other shapes.

The non-display region NDA may be disposed adjacent to both short sides and both long sides of the display region DA. In this case, it is possible to surround all sides of the display region DA and constitute an edge of the display region DA. However, the invention is not limited thereto, and the non-display region NDA may be disposed adjacent to only both short sides or both long sides of the display region DA.

The display panel 100 may include a main region MR, a bending region BR, and a sub region SR.

The main region MR may be a flat region in which the display region DA is disposed. The main region MR may have an approximately quadrangular (e.g., rectangular) shape in a plan view. The main region MR may include a part of the non-display region NDA.

The bending region BR and the sub region SR may be disposed in the non-display region NDA.

The bending region BR may be disposed at one side of the main region MR. In an embodiment, as shown in FIG. 1, the bending region BR may be connected to a lower side of the main region MR, for example, but is not limited thereto. The bending region BR may be bent so that the sub region SR overlaps the main region MR.

The sub region SR may extend from the bending region BR. The sub region SR may be connected to the main region MR by the bending region BR.

The sub region SR may include a first connection region PR1 and a second connection region PR2. The first connection region PR1 and the second connection region PR2 may be regions that are each provided with a pad electrode PE to be electrically connected to other electronic devices or components. That is, the first connection region PR1 and the second connection region PR2 may mean pad regions. A driving member 200 and the printed circuit board 300 which will be described later may be electrically connected to the display panel 100 by the first connection region PR1 and the second connection region PR2, respectively.

The display device 1 may further include the driving member 200 and the printed circuit board 300.

The driving member 200 may be disposed in the first connection region PR1 in the sub region SR. The driving member 200 may drive a pixel circuit of the display panel 100. The driving member 200 may be, for example, a display driver integrated circuit. In an embodiment, the driving member 200 may be attached to the display panel 100 by a chip on plastic ("COP") method, a chip on glass ("COG") method, or a chip on film ("COF") method. In an embodiment, the driving member 200 attached by the COP method is exemplified, but the driving member 200 is not limited thereto.

One side of the printed circuit board 300 may be attached to the second connection region PR2 in the sub region SR. The printed circuit board 300 may be a flexible circuit board. Although not shown, the display device 1 may further include a main circuit board attached to the other side of the printed circuit board 300.

Referring to FIGS. 1 and 2, the display panel 100 may further include a substrate SUB, a display member DM disposed on the substrate SUB, and an encapsulation layer TFE disposed on the display member DM. Although not shown, the display panel 100 may further include functional layers such as a touch layer, an antireflection layer, a refractive index control layer, and the like.

The substrate SUB may be disposed over the display region DA and the non-display region NDA. The substrate SUB may be a rigid substrate SUB including a rigid material such as glass, quartz, or the like or may be a flexible substrate SUB including a flexible material such as flexible glass, polyimide, or the like.

Referring to FIGS. 1 to 3, the display panel 100 may further include a plurality of pad electrodes PE, a first line 121, and a second line 122.

The plurality of pad electrodes PE may be disposed in the first connection region PR1 and the second connection region PR2. The plurality of pad electrodes PE may each have an approximately quadrangular (e.g., rectangular) shape in a plan view, but are not limited thereto. As shown in FIG. 3, the plurality of pad electrodes PE may be arranged to form at least one row and/or at least one column in a plan view. In FIG. 3, the plurality of pad electrodes PE is arranged to form a plurality of rows extending in the first direction X and spaced apart from each other in the second direction Y in the first connection region PR1, and the plurality of pad electrodes PE may be arranged to form one row extending in the first direction X in the second connection region PR2, but the number and arrangement method of the plurality of pad electrodes PE are not limited thereto.

As shown in FIG. 3, a planar size of the pad electrode may be larger than that of each of the lead electrode and the bump, but the size relationship between the pad electrode, the lead electrode, and the bump is not limited thereto.

The plurality of pad electrodes PE may be electrically connected to the display member DM by the first line 121 and the second line 122 disposed on the substrate SUB. The first line 121 may electrically connect the display member DM and the pad electrodes PE in the first connection region PR1, and the second line 122 may electrically connect the pad electrodes PE in the first connection region PR1 and the pad electrodes PE in the second connection region PR2. In an embodiment, the plurality of pad electrodes PE may be electrically connected to at least one of a plurality of conductive layers (refer to 120, 130, 140, and 150 in FIG. 4) of the display panel 100 which will be described later, for example. The display member DM may be disposed in the display region DA. As will be described later, the display member DM may include an insulating layer, a circuit device, and a self-luminous device. In an embodiment, the self-luminous device may be an organic light emitting device, for example.

The encapsulation layer TFE is disposed on the display member DM to seal the display member DM. The encapsulation layer TFE may perform a function of preventing penetration of moisture and oxygen.

The display device 1 may further include an adhesion member RS, which adheres the driving member 200 and the printed circuit board 300 to the display panel 100, and conductive particles CP dispersed in the adhesion member RS. Hereinafter, in FIGS. 5A and 5B, the adhesion member RS and the conductive particles CP will be described in detail.

The driving member 200 may include a driving chip DIC and a plurality of bumps BP.

The driving chip DIC may include a circuit disposed (e.g., mounted) to drive a pixel of the display panel 100.

As shown in FIG. 2, the plurality of bumps BP may be disposed on one surface, for example, a lower surface of the driving chip DIC facing the substrate SUB. The plurality of bumps BP may be disposed on the plurality of pad electrodes PE. The plurality of bumps BP may overlap the plurality of pad electrodes PE in the thickness direction, respectively. The driving member 200 may be attached to the display panel 100 by the adhesion member RS, and the plurality of bumps BP may be electrically connected to the plurality of pad electrodes PE in the first connection region PR1 by the plurality of conductive particles CP dispersed in the adhesion member RS.

As shown in FIG. 3, each of the bumps BP may have an approximately quadrangular (e.g., rectangular) shape in a plan view, but the shape is not limited thereto. The plurality of bumps BP may respectively overlap the plurality of pad electrodes PE in a plan view. The plurality of bumps BP may be arranged in shapes corresponding to the plurality of pad electrodes PE in a plan view. The plurality of bumps BP may be arranged to form at least one row and/or at least one column in a plan view. In FIG. 3, the plurality of bumps BP may be arranged to form a plurality of rows extending in the first direction X and spaced apart from each other in the second direction Y in the first connection region PR1, but the number and arrangement method of the bumps BP are not limited thereto.

The printed circuit board 300 may include a base film BF and a plurality of lead electrodes LE.

The base film BF may include a flexible material such as polyimide, but is not limited thereto.

The plurality of lead electrodes LE may be disposed on one surface of the base film BF facing the substrate SUB. The plurality of lead electrodes LE may be disposed on the plurality of pad electrodes PE. The printed circuit board 300 may be attached to the display panel 100 by the adhesion member RS, and the plurality of lead electrodes LE may be electrically connected to the plurality of pad electrodes PE in the second connection region PR2 by the plurality of conductive particles CP dispersed in the adhesion member RS.

As shown in FIG. 3, the plurality of lead electrodes LE may each have an approximately quadrangular (e.g., rectangular) shape in a plan view, but are not limited thereto. The plurality of lead electrodes LE may respectively overlap the plurality of pad electrodes PE in a plan view. The plurality of lead electrodes LE may be arranged in shapes corresponding to the plurality of pad electrodes PE in a plan view. The plurality of lead electrodes LE may be arranged to form at least one row and/or at least one column in a plan view. In FIG. 3, the plurality of lead electrodes LE may be arranged to form one column extending in the first direction X in the second connection region PR2, but the number and arrangement method of the plurality of lead electrodes LE are not limited thereto.

The pad electrode PE, the bump BP, the lead electrode LE, the first line 121, and the second line 122 may each include a conductive material. Examples of the conductive material may include one or more metals including at least one of molybdenum (Mo), aluminum (Al), platinum (Pt), palladium (Pd), silver (Ag), magnesium (Mg), gold (Au), nickel (Ni), neodymium (Nd), Iridium (Ir), chromium (Cr), calcium (Ca), titanium (Ti), tantalum (Ta), tungsten (W), and copper (Cu).

Referring to FIGS. 1 to 4, the display member DM may include a plurality of conductive layers 120, 130, 140, 150 disposed on the substrate SUB, a plurality of insulating layers 111, 112, 113, VIA1, VIA2 which insulate the plurality of conductive layers 120, 130, 140, 150, and a light emitting layer EL.

A buffer layer BF may be disposed on the substrate SUB. The buffer layer BF may prevent penetration of moisture and oxygen from the outside through the substrate SUB. In an embodiment, the buffer layer BF may include at least one of a silicon nitride ($SiN_x$) film, a silicon oxide ($SiO_2$) film, and a silicon oxynitride ($SiO_xN_y$) film, for example.

A semiconductor layer 105 may be disposed on the buffer layer BF. The semiconductor layer 105 forms a channel of a thin film transistor. The semiconductor layer 105 may be disposed in each pixel of the display region DA and may also be disposed in the non-display region NDA in some cases. The semiconductor layer 105 may include polycrystalline silicon.

A first insulating layer 111 may be disposed on the semiconductor layer 105. The first insulating layer 111 may be disposed over the entire substrate SUB. The first insulating layer 111 may be a gate insulating film having a gate insulating function.

The first insulating layer 111 may include a silicon compound, a metal oxide, and the like. In an embodiment, the first insulating layer 111 may include silicon oxide, silicon nitride, silicon oxynitride, aluminum oxide, tantalum oxide, hafnium oxide, zirconium oxide, titanium oxide, and the like, for example. These may be used alone or in combination with each other.

A first conductive layer 120 may be disposed on the first insulating layer 111. The first conductive layer 120 may include a gate electrode GE of a thin film transistor TFT and a first electrode CE1 of a storage capacitor.

In an embodiment, the first conductive layer 120 may include one or more metals including at least one of molybdenum (Mo), aluminum (Al), platinum (Pt), palladium (Pd), silver (Ag), magnesium (Mg), gold (Au), nickel (Ni), neodymium (Nd), Iridium (Ir), chromium (Cr), calcium (Ca), titanium (Ti), tantalum (Ta), tungsten (W), and copper (Cu). The first conductive layer 120 may be a single film or a stacked film including the exemplified material.

A second insulating layer 112 may be disposed on the first conductive layer 120. The second insulating layer 112 may insulate the first conductive layer 120 and a second conductive layer 130. The second insulating layer 112 may include at least one of exemplified materials of the first insulating layer 111.

The second conductive layer 130 may be disposed on the second insulating layer 112. The second conductive layer 130 may include a second electrode CE2 of the storage capacitor. A material of the second conductive layer 130 may include at least one of the exemplified materials of the above-described first conductive layer 120. The first electrode CE1 of the storage capacitor and the second electrode CE2 of the storage capacitor may form a capacitor through the second insulating layer 112.

A third insulating layer 113 may be disposed on the second conductive layer 130. The third insulating layer 113 may include at least one of the exemplary materials of the above-described first insulating layer 111. In some embodiments, the third insulating layer 113 may include an organic insulating material. The organic insulating material may include at least one of exemplary materials of a first via layer VIA1 which will be described later.

A third conductive layer 140 may be disposed on the third insulating layer 113. The third conductive layer 140 may include a source electrode SE, a drain electrode DE, a high potential voltage electrode ELVDDE, and a signal line.

In an embodiment, the third conductive layer 140 may include at least one among molybdenum (Mo), aluminum (Al), platinum (Pt), palladium (Pd), silver (Ag), magnesium (Mg), gold (Au), nickel (Ni), neodymium (Nd), Iridium (Ir), chromium (Cr), calcium (Ca), titanium (Ti), tantalum (Ta), tungsten (W), and copper (Cu). The third conductive layer 140 may be a single film including the exemplified material but is not limited thereto and may be a stacked film. In an embodiment, the third conductive layer 140 may be formed or provided in a stacked structure such as Ti/Al/Ti, Mo/Al/Mo, Mo/AlGe/Mo, or Ti/Cu, for example. In an embodiment, the third conductive layer 140 may include Ti/Al/Ti.

The first via layer VIA1 may be disposed on the third conductive layer 140. The first via layer VIA1 may include an organic insulating material. In an embodiment, the organic insulating material may include at least one among an acrylic resin (a polyacrylate resin), an epoxy resin, a phenolic resin, a polyamide resin, a polyimide resin, an unsaturated polyester resin, a polyphenylenether resin, a polyphenylenesulfide resin, and benzocyclobutene ("BCB").

Upper structures of the third insulating layer 113 and the third conductive layer 140 may be removed or omitted in the first connection region PR1 and the second connection region PR2.

A fourth conductive layer 150 may be disposed on the first via layer VIAL The fourth conductive layer 150 may include a data line DL, a connection electrode CNE, and a high potential voltage line ELVDDL. The data line DL may be electrically connected to the source electrode SE of the thin film transistor TFT through a contact hole passing through the first via layer VIAL The connection electrode CNE may be electrically connected to the drain electrode DE of the thin film transistor TFT through a contact hole passing through the first via layer VIA'. The high potential voltage line ELVDDL may be electrically connected to the high potential voltage electrode ELVDDE through a contact hole passing through the first via layer VIAL The fourth conductive layer 150 may include a material including at least one of the exemplary materials of the third conductive layer 140.

A second via layer VIA2 may be disposed on the fourth conductive layer 150. The second via layer VIA2 may include at least one of the exemplified materials of the above-described first via layer VIA'.

An anode AND may be disposed on the second via layer VIA2. The anode AND may be electrically connected to the connection electrode CNE through a contact hole passing through the second via layer VIA2.

A bank layer BANK may be disposed on the anode AND. A contact hole which exposes the anode AND may be defined in the bank layer BANK. The bank layer BANK may include an organic insulating material or an inorganic insulating material. In an embodiment, the bank layer BANK may include at least one of a photoresist, a polyimide resin, an acrylic resin, a silicon compound, a polyacrylic resin, and the like, for example.

The light emitting layer EL may be disposed on an upper surface of the anode AND and in an opening OP of the bank layer BANK. A cathode CAT is disposed on the light emitting layer EL and the bank layer BANK. The cathode CAT may be a common electrode disposed over a plurality of pixels.

A thin film encapsulation layer TFE is disposed on the cathode CAT. The thin film encapsulation layer TFE may cover an organic light emitting device ("OLED"). The thin film encapsulation layer TFE may be a stacked film in which inorganic films and organic films are alternately stacked. In an embodiment, the thin film encapsulation layer TFE may include a first encapsulation inorganic film 171, an encapsulation organic film 172, and a second encapsulation inorganic film 173 which are sequentially stacked, for example.

Hereinafter, the first connection region PR1 and the second connection region PR2 will be described in detail with reference to FIGS. 5A, 5B and 6.

Figure 5A:
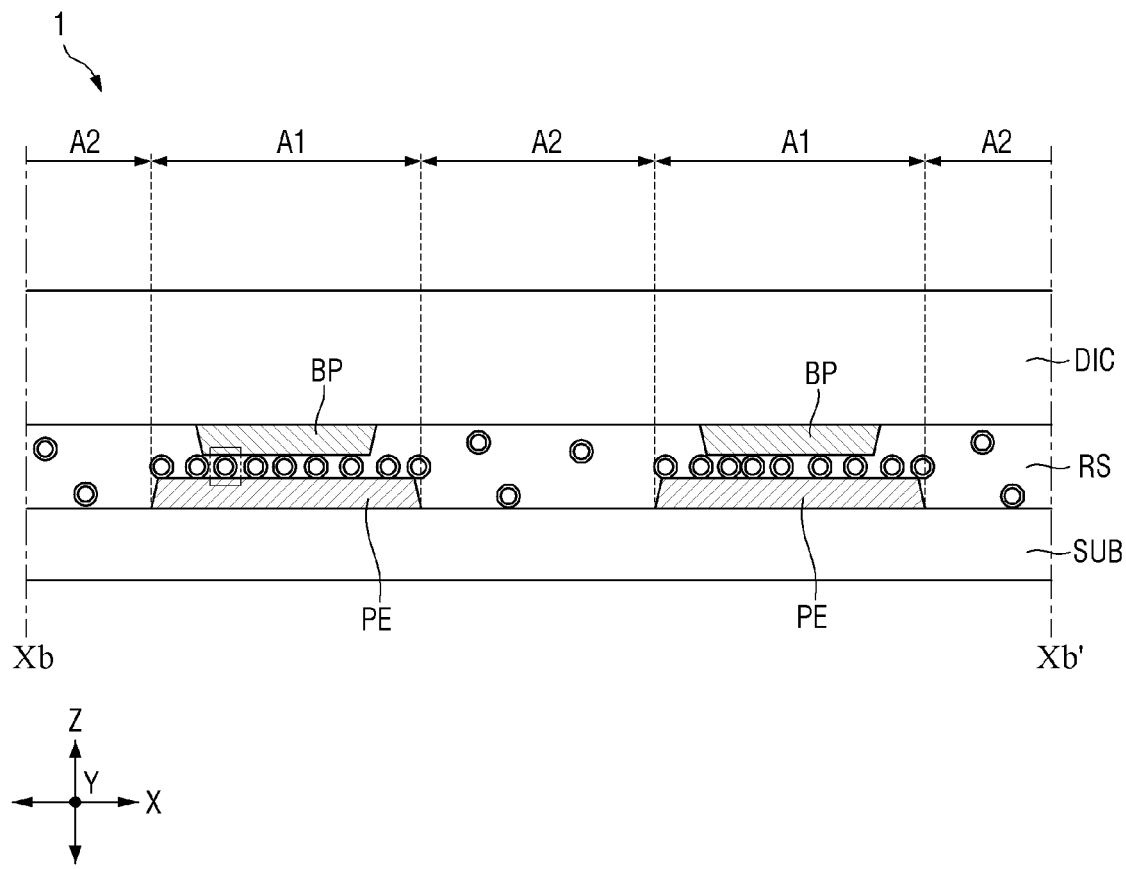
FIG. 5A is a cross-sectional view taken along line Xb-Xb' in FIG. 1.
Figure 5B:
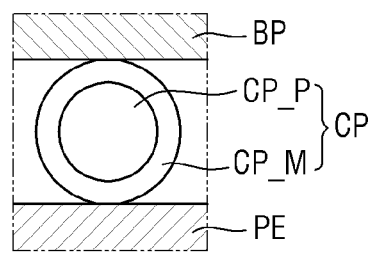
FIG. 5B is an enlarged view of a portion of FIG. 5A.
Figure 6:
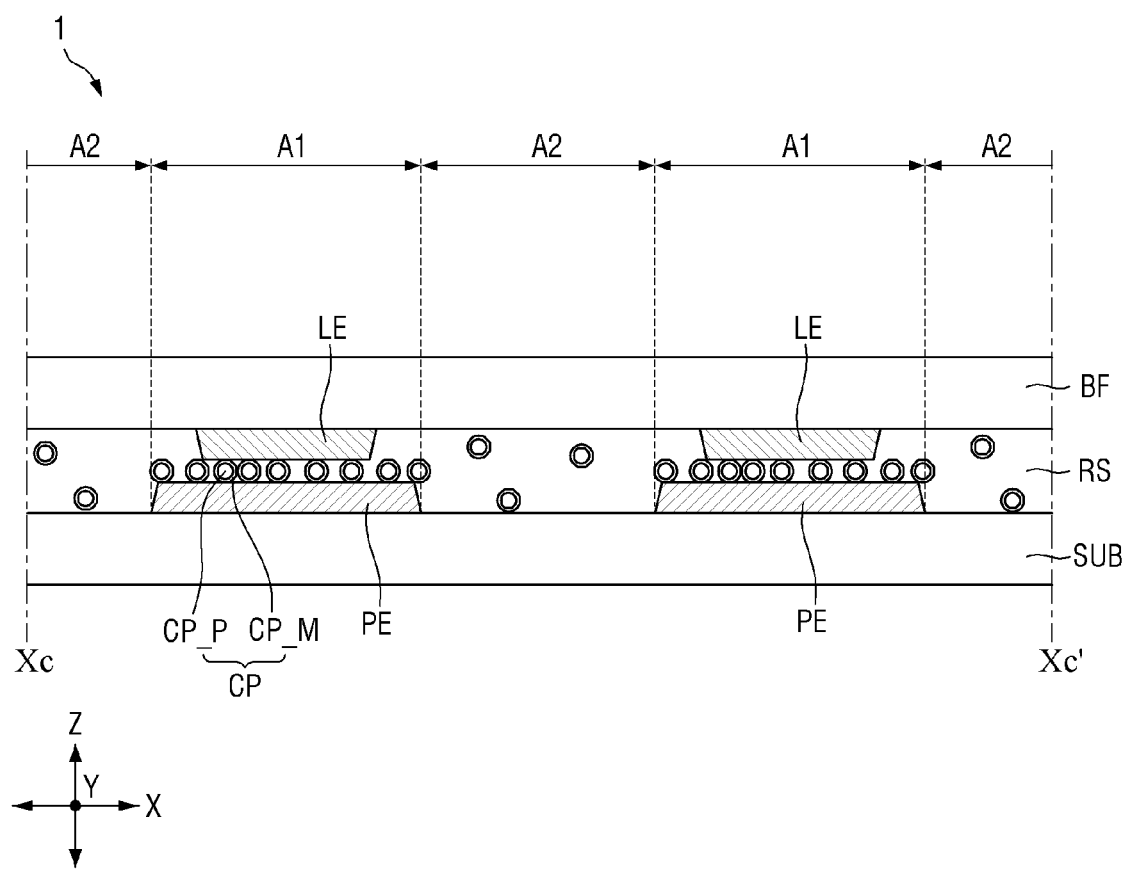
FIG. 6 is a cross-sectional view taken along line Xc-Xc' in FIG. 1.

FIG. 5A is a cross-sectional view taken along line Xb-Xb' in FIG. 1, FIG. 5B is an enlarged view of a portion of FIG. 5A, and FIG. 6 is a cross-sectional view taken along line Xc-Xc' in FIG. 1.

Referring to FIGS. 1 to 5B, in the first connection region PR1, the driving member 200 and the substrate SUB of the display panel 100 may face each other. In the first connection region PR1, the driving member 200 may be attached to the substrate SUB of the display panel 100 by the adhesion member RS, and the plurality of pad electrodes PE and the plurality of bumps BP may be electrically connected by the conductive particles CP interposed therebetween.

The plurality of pad electrodes PE and the plurality of bumps BP may face each other in a cross section. In an embodiment, the plurality of pad electrodes PE may be disposed on an upper surface of the substrate SUB, and the plurality of bumps BP may be disposed on a lower surface of the driving member 200 opposite the upper surface of the substrate SUB, for example. Although not shown, the pad electrode PE and the bump BP may each have an approximately quadrangular (e.g., rectangular) shape in a plan view. However, the invention is not limited thereto, and the shapes of the pad electrode PE and the bump BP may be variously changed.

The adhesion member RS may be interposed between the driving member 200 and the display panel 100. The adhesion member RS may include an insulating adhesion material. The adhesion member RS may include a thermosetting resin, an ultraviolet curing resin, and a thermoplastic resin. In an embodiment, the adhesion member RS may include a styrene butadiene resin, a polyvinyl butylene resin, an epoxy resin, a polyurethane resin, an acrylic resin, and the like, for example.

The conductive particles CP may include a conductive material, for example, a metal. The conductive particles CP have a fine size and are scattered in the adhesion member RS. In an embodiment, the conductive particles CP may be a conductive ball having a fine size of about 3 micrometers (μm) to about 15 μm in diameter and including a polymer particle CP_P and a metal coating layer CP_M such as Au, Ni or Pd coating the polymer particle CP_P, for example. However, the invention is not limited thereto, and the conductive particles CP may be a conductive nanowire or conductive paste.

The adhesion member RS may include first adhesion regions A1 and second adhesion regions A2. As shown in FIG. 5A, the plurality of first adhesion regions A1 and the plurality of second adhesion regions A2 may be alternately disposed.

The first adhesion region A1 may be a region where at least a part of the pad electrode PE and at least a part of the bump BP overlap in the thickness direction. In FIG. 5A, a width of the pad electrode PE is larger than that of the bump BP, but the width is not limited thereto. The width of the pad electrode PE may be the same as or smaller than that of the bump BP.

The second adhesion region A2 may be a region where the pad electrode PE and the bump BP do not overlap in the thickness direction. The second adhesion region A2 may be a region between the plurality of pad electrodes PE and/or between the plurality of bumps BP. The second adhesion region A2 may be a region between the plurality of first adhesion regions A1.

In the first adhesion region A1, some of the plurality of conductive particles CP may be interposed between the pad electrode PE and the bump BP and contact the pad electrode PE and the bump BP to electrically connect the pad electrode PE and the bump BP. In the second adhesion region A2, the remaining conductive particles CP may be dispersed in a space between the plurality of pad electrodes PE (between the plurality of bumps BP).

A density of the conductive particles CP dispersed in the first adhesion region A1 may be greater than a density of the conductive particles CP dispersed in the second adhesion region A2. The density of the conductive particles CP may be the number of conductive particles CP disposed in the first adhesion region A1 or the second adhesion region A2. In other words, a density of the conductive particles CP disposed on the plurality of pad electrodes PE (the plurality of bumps BP) may be greater than a density of the conductive particles CP disposed in the space between the plurality of pad electrodes PE (the plurality of bumps BP). As described later, a difference in density of the conductive particles CP may be caused by alignment of the conductive particles CP by an electric field before curing of the adhesion member RS. Although not shown, the conductive particles CP may be disposed only in the first adhesion region A1, and the conductive particles CP may not be disposed in the second adhesion region A2.

As shown on the left side of FIGS. 5A and 5B, the plurality of conductive particles CP is dispersed in the first adhesion region A1 with a higher density than in the second adhesion region A2, and the plurality of conductive particles CP may be irregularly dispersed.

As shown on the right side of FIGS. 5A and 5B, the plurality of conductive particles CP may be dispersed in the first adhesion region A1 to have a uniform tendency. In an embodiment, the conductive particles CP may be relatively uniformly dispersed within a predetermined error range and may also be dispersed to have a density which increases or decreases toward a center of the first adhesion region A1 (a center of the pad electrode PE and/or a center of the bump BP), for example.

Referring to FIGS. 1 to 6, a method in which the printed circuit board 300 is attached to the display panel 100 in the second connection region PR2 may be substantially the same as or similar to a method in which the driving member 200 is attached to the display panel 100 in the first adhesion region A1. That is, in the second connection region PR2, a structure in which the printed circuit board 300 and the display panel 100 are attached by the adhesion member RS, and the pad electrode PE and the bump BP are electrically connected by the conductive particles CP, may be substantially the same as or similar to that in the first connection region PR1.

As shown in FIG. 6, in the second connection region PR2, the printed circuit board 300 and the substrate SUB of the display panel 100 may face each other. In the second connection region PR2, the printed circuit board 300 may be attached to the substrate SUB of the display panel 100 by the adhesion member RS, and the plurality of pad electrodes PE and the plurality of lead electrodes LE may be electrically connected by the conductive particles CP interposed therebetween.

The plurality of pad electrodes PE and the plurality of lead electrodes LE may face each other in a cross section. In an embodiment, the plurality of pad electrodes PE may be disposed on the upper surface of the substrate SUB, and the plurality of lead electrodes LE may be disposed on the lower surface of the driving member 200 opposite the upper surface of the substrate SUB, for example. Although not shown, the pad electrode PE and the lead electrode LE may each have an approximately quadrangular (e.g., rectangular) shape in a plan view. However, the invention is not limited thereto, and the shapes of the pad electrode PE and the bump BP may be variously changed.

The adhesion member RS shown in FIG. 6 may include a material substantially the same as or similar to the adhesion member RS in FIGS. 5A and 5B. The adhesion member RS interposed between the printed circuit board 300 and the substrate SUB of the display panel 100 may be another adhesion member RS separated from the adhesion member RS interposed between the driving member 200 and the display panel 100. The conductive particles CP shown in FIG. 6 may also be substantially the same as or similar to the conductive particles CP shown in FIGS. 5A and 5B.

Like the case in FIGS. 5A and 5B, the adhesion member RS interposed between the printed circuit board 300 and the substrate SUB of the display panel 100 may also be partitioned into a first adhesion region A1 and a second adhesion region A2. In this case, the first adhesion region A1 may be a region where at least a part of the pad electrode PE and at least a part of the lead electrode LE overlap in the thickness direction, and the second adhesion region A2 may be a region where the pad electrode PE and the lead electrode LE do not overlap.

In the first adhesion region A1, some of the plurality of conductive particles CP may be interposed between the pad electrode PE and the lead electrode LE and may contact the pad electrode PE and the lead electrode LE to electrically connect the pad electrode PE and the lead electrode LE. In the second adhesion region A2, the remaining conductive particles CP may be dispersed in the space between the plurality of pad electrodes PE (between the plurality of lead electrodes LE).

A density of the conductive particles CP dispersed in the first adhesion region A1 may be greater than a density of the conductive particles CP dispersed in the second adhesion region A2. The density of the conductive particles CP may be the number of conductive particles CP disposed in the first adhesion region A1 or the second adhesion region A2. In other words, a density of the conductive particles CP disposed on the plurality of pad electrodes PE (the plurality of lead electrodes LE) may be greater than a density of the conductive particles CP disposed in the space between the plurality of pad electrodes PE (the plurality of lead electrodes LE). As described later, a difference in density of the conductive particles CP may be caused by the alignment of the conductive particles CP by an electric field before curing of the adhesion member RS. Although not shown, the conductive particles CP may be disposed only in the first adhesion region A1, and the conductive particles CP may not be disposed in the second adhesion region A2.

Although not shown, at least one insulating layer may be interposed between the substrate SUB and the plurality of pad electrodes PE. In an embodiment, at least one of the buffer layer BF, the first insulating layer 111, and the second insulating layer 112 in FIG. 4 may be interposed, for example. The plurality of pad electrodes PE may be formed or provided simultaneously with at least one of the plurality of conductive layers 120, 130, 140, and 150 in FIG. 4. The plurality of pad electrodes PE may be formed or provided in the same layer as at least one of the plurality of conductive layers 120, 130, 140, and 150 in FIG. 4.

Figure 7:
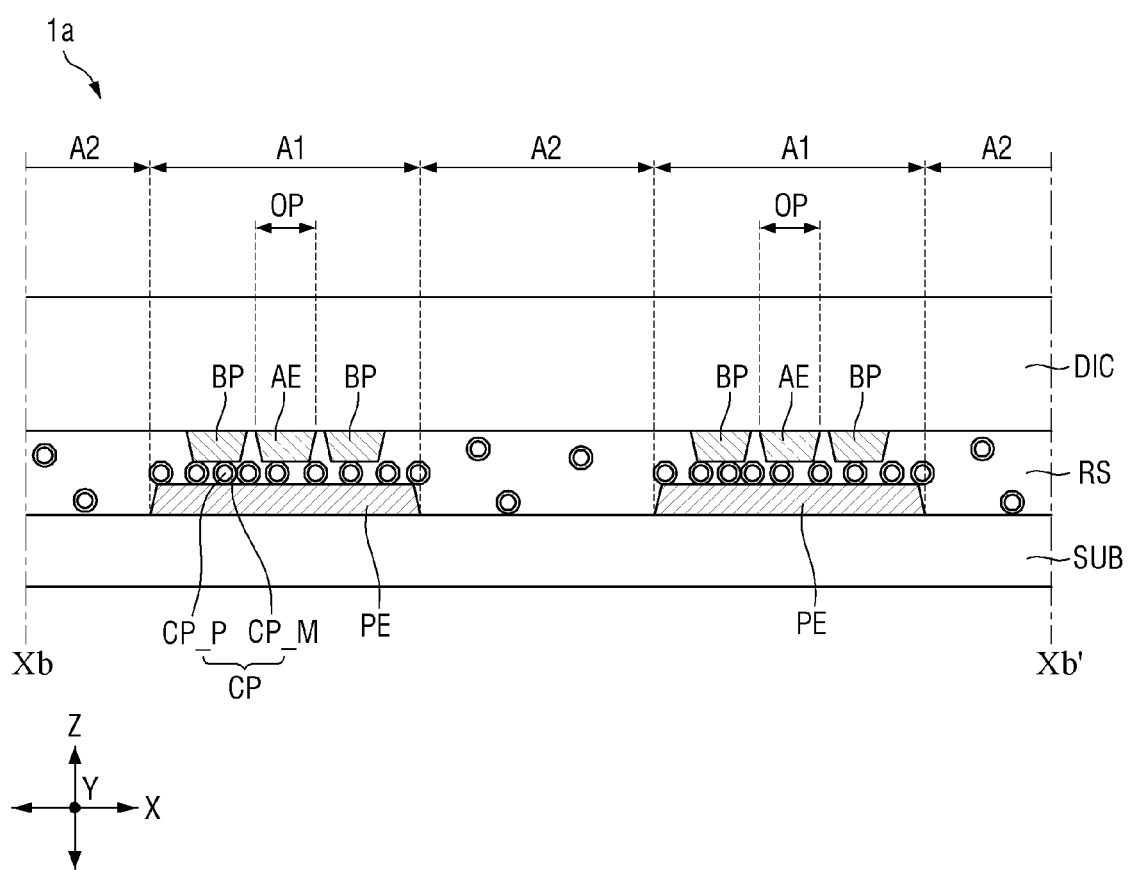
FIG. 7 is a cross-sectional view of another embodiment of a display device.
Figure 8:
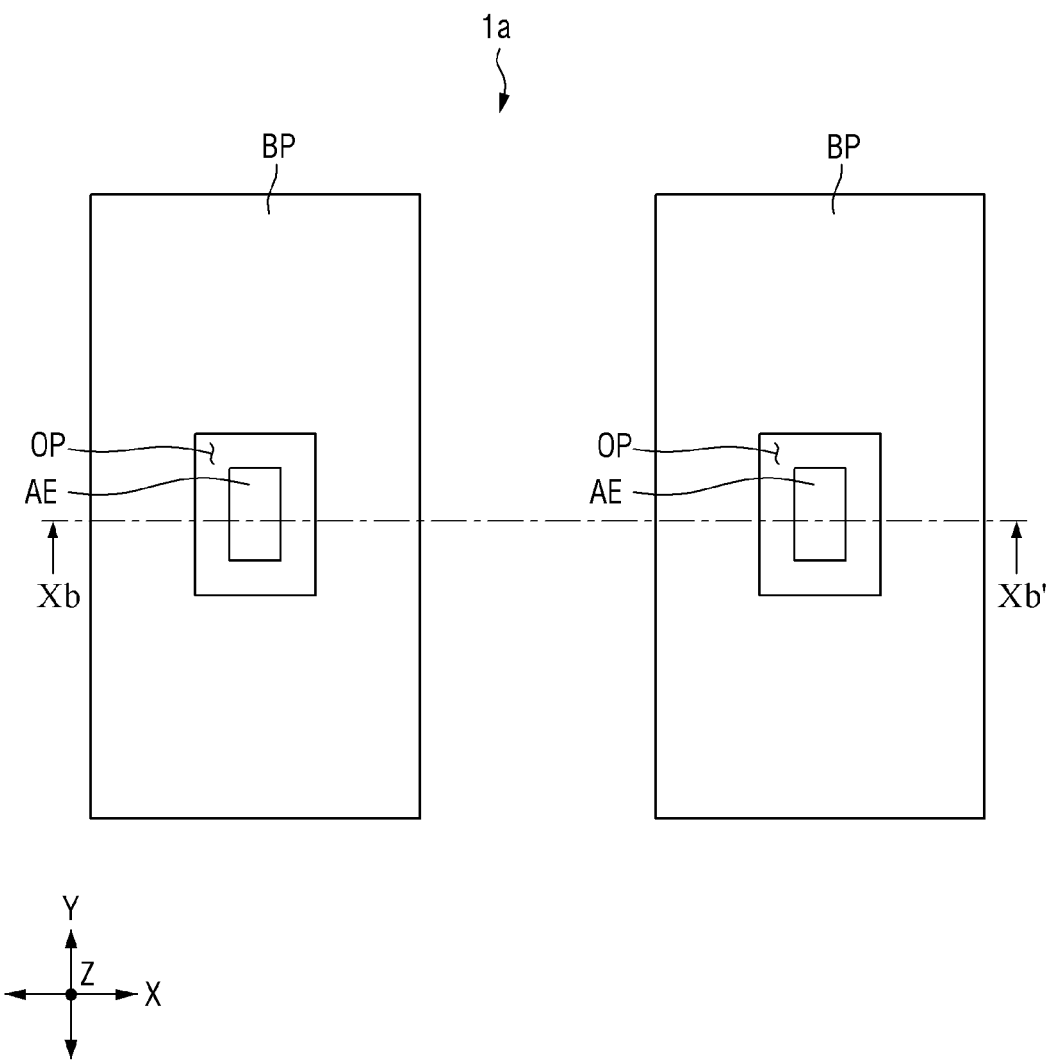
FIG. 8 is a conceptual plan view illustrating the arrangement of a plurality of bumps and a plurality of alignment electrodes in FIG. 7.

FIG. 7 is a cross-sectional view of another embodiment of a display device. FIG. 8 is a conceptual plan view illustrating the arrangement of a plurality of bumps and a plurality of alignment electrodes in FIG. 7.

Referring to FIGS. 7 and 8, an opening OP may be defined in each of a plurality of bumps BP.

The opening OP passing through the bump BP in a thickness direction may be defined in the middle of the bump BP. In a plan view, the plurality of bumps BP is arranged in a first direction X, and may each have a quadrangular (e.g., rectangular) shape which is elongated in a second direction Y.

A display device 1a may further include alignment electrodes AE disposed on at least one of a substrate SUB, a printed circuit board 300, and a driving member 200. In FIGS. 7 and 8, the alignment electrode AE is disposed in the bump BP of the driving member 200 but is not limited thereto. As described later, the alignment electrode AE may also be disposed on a lead electrode LE of the printed circuit board 300 and/or a pad electrode PE of the display panel 100.

As shown in FIGS. 7 and 8, a plurality of alignment electrodes AE may be respectively disposed in the plurality of bumps BP. In this case, each alignment electrode AE may be disposed in the opening OP of each of the bumps BP. That is, in a plan view, the alignment electrodes AE may be surrounded by the bumps BP.

The plurality of alignment electrodes AE may respectively overlap the plurality of pad electrodes PE, in the thickness direction. The plurality of alignment electrodes AE may respectively face the plurality of pad electrodes PE.

The opening OP and the alignment electrode AE may be disposed at the center of the bump BP and may each have an approximately square shape in a plan view. However, the invention is not limited thereto, and the opening OP and the alignment electrode AE may each have various shapes such as a polygonal shape, a circular shape, an oval shape, and the like. The first direction X and the second direction Y are not limited to the first direction X and the second direction Y in FIGS. 1 to 6.

The alignment electrode AE may be spaced apart from the bump BP in a plan view. The alignment electrode AE and the bump BP may be electrically separated. Although not shown, an insulating member which mutually insulates the alignment electrode AE and the bump BP may be interposed between the alignment electrode AE and the bump BP.

As described later, the alignment electrode AE may be used to align conductive particles CP before curing of an adhesion member RS in manufacturing the display panel 100. The alignment electrode AE disposed at the middle of each bump BP may function as a point source which applies an electric field for alignment of the conductive particles CP so that the conductive particles CP may be efficiently concentrated toward a center of the first region, which is a center of a space between the pad electrode PE and the bump BP.

Since the embodiment in FIGS. 7 and 8 is substantially the same as or similar to the embodiment in FIGS. 1 to 6 except that the alignment electrodes AE are further disposed, overlapping descriptions will be omitted.

Figure 9:
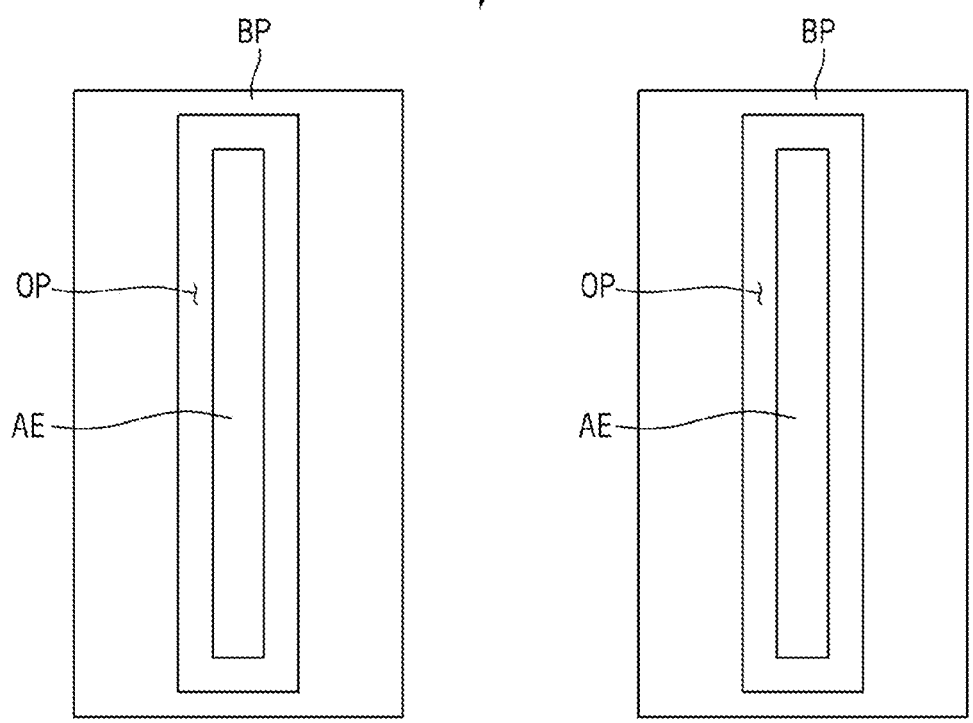
FIG. 9 is a conceptual plan view illustrating another embodiment of the arrangement of a plurality of bumps and a plurality of alignment electrodes of a display device.

FIG. 9 is a conceptual plan view illustrating another embodiment of the arrangement of a plurality of bumps and a plurality of alignment electrodes of a display device.

Referring to FIG. 9, unlike the embodiment in FIG. 8, in the display device 1b, an opening OP and an alignment electrode AE may have a quadrangular (e.g., rectangular) shape which is elongated in a second direction Y. The second direction Y may be a direction which intersects a first direction X in which a plurality of bumps BP is arranged.

Referring to FIGS. 7 and 9, since the alignment electrode AE has an elongated shape in the second direction Y in a plan view, before curing of the adhesion member RS, the plurality of conductive particles CP disposed in the second adhesion region A2 between the plurality of bumps BP (the plurality of pad electrodes PE) along the second direction Y may be more uniformly concentrated toward adjacent alignment electrode AE or pad electrode PE.

Since the embodiment in FIG. 9 is substantially the same as or similar to the embodiment in FIGS. 7 and 8 except for the shapes of the opening OP and the alignment electrode AE, overlapping descriptions will be omitted.

Figure 10:
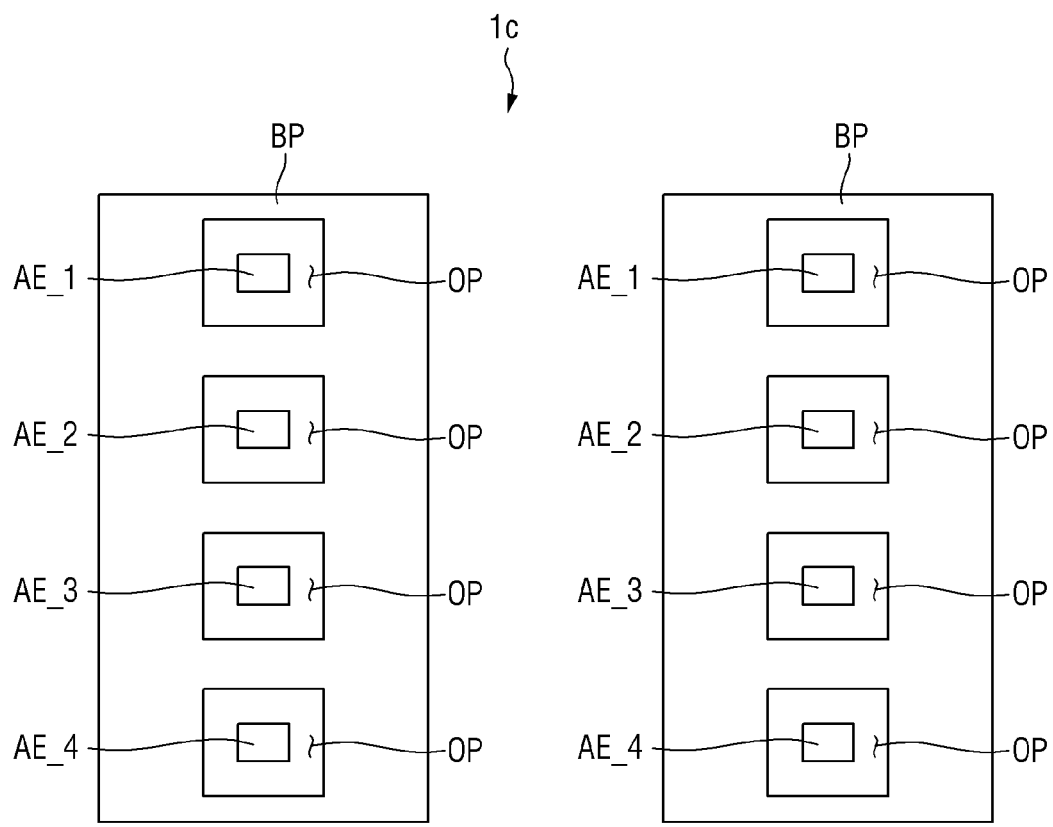
FIG. 10 is a conceptual plan view illustrating another embodiment of the arrangement of a plurality of bumps and a plurality of alignment electrodes of a display device.

FIG. 10 is a conceptual plan view illustrating another embodiment of the arrangement of a plurality of bumps and a plurality of alignment electrodes of a display device.

Referring to FIG. 10, unlike the embodiment in FIG. 8, in the display device 1c, a plurality of openings OP and a plurality of alignment electrodes AE may be disposed in one bump BP. In FIG. 10, four openings OP and four alignment electrodes AE_1 to AE_4 are disposed in one bump BP, but the number of openings OP and the number of alignment electrodes AE disposed in one bump BP are not limited thereto.

The plurality of openings OP and the plurality of alignment electrodes AE disposed in one bump BP may be arranged at a center portion of the bump BP in a second direction Y. The plurality of openings OP and the plurality of alignment electrodes AE disposed in one bump BP may form a plurality of point sources for applying an electric field in the bump.

Referring to FIGS. 7 and 10, since the plurality of openings OP and the plurality of alignment electrodes AE are arranged in one bump BP in the second direction Y, before curing of the adhesion member RS, the plurality of conductive particles CP disposed in the second adhesion region A2 between the plurality of bumps BP (the plurality of pad electrodes PE) along the second direction Y may be more uniformly concentrated toward adjacent alignment electrode AE or pad electrode PE.

Since the embodiment in FIG. 10 is substantially the same as or similar to the embodiment in FIGS. 7 and 8 except for the shapes of the opening OP and the alignment electrode AE, overlapping descriptions will be omitted.

Figure 11:
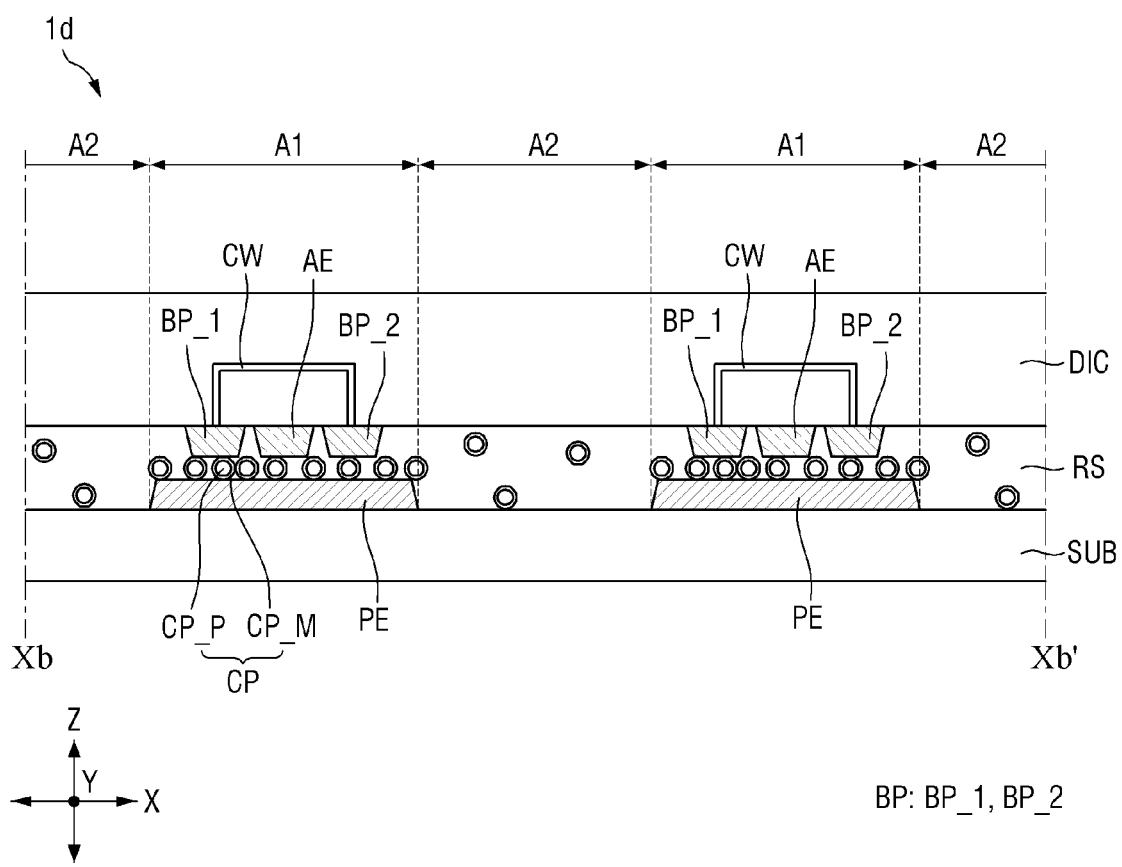
FIG. 11 is a cross-sectional view of another embodiment of a display device.
Figure 12:
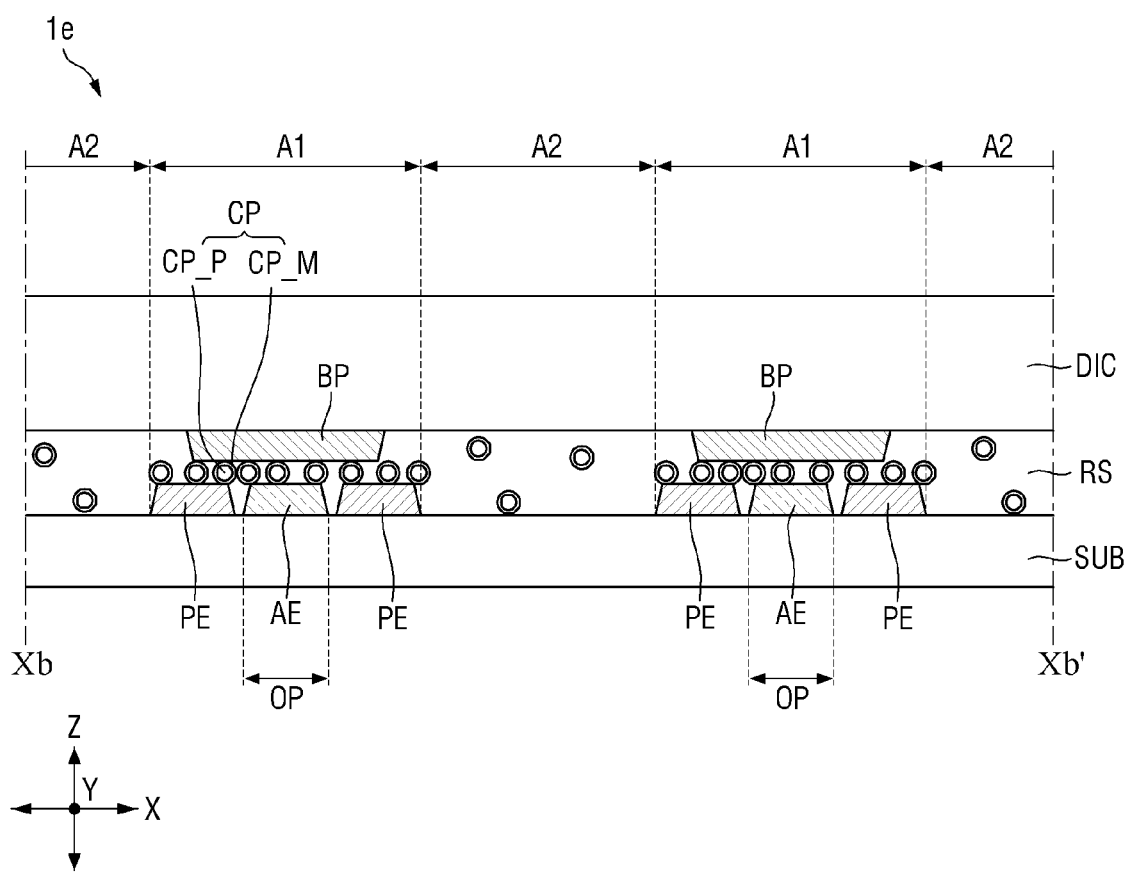
FIG. 12 is a conceptual plan view illustrating the arrangement of a plurality of bumps and a plurality of alignment electrodes in FIG. 11.

FIG. 11 is a cross-sectional view of another embodiment of a display device. FIG. 12 is a conceptual plan view illustrating the arrangement of a plurality of bumps and a plurality of alignment electrodes in FIG. 11.

Referring to FIGS. 11 and 12, a plurality of bumps BP respectively faces a plurality of pad electrodes PE, and each bump BP may include a first sub bump BP_1 and a second sub bump BP_2.

The first sub bump BP_1 and the second sub bump BP_2 may be arranged in the first direction X and may be separated from each other. As shown in FIG. 11, the first sub bump BP_1 and the second sub bump BP_2 may be electrically connected by a connection line CW provided in a driving member 200. In this case, an alignment electrode AE may be electrically separated from the connection line CW, the first sub bump BP_1, and the second sub bump BP_2. In an embodiment, although not shown, a display device 1d may further include at least one insulating layer insulating the alignment electrode AE from the connection line CW, the first sub bump BP_1, and the second sub bump BP_2, for example.

As shown in FIG. 12, the first sub bump BP_1, the second sub bump BP_2, and the alignment electrode AE disposed therebetween may each have a shape which is elongated in the second direction Y in a plan view. The first sub bump BP_1, the second sub bump BP_2, and the alignment electrode AE may each have a quadrangular (e.g., rectangular) shape in a plan view but are not limited thereto.

Widths of the first and second sub bumps BP_1 and BP_2 in the first direction X may be greater than a width of the alignment electrode AE interposed therebetween in the first direction X. Accordingly, a sheet resistance of the bump BP may decrease. However, the invention is not limited thereto, and the width of each of the first sub bump BP_1 and the second sub bump BP_2 in the first direction X may be less than or equal to the width in the first direction X of the alignment electrode AE interposed therebetween.

Since the alignment electrode AE extends to edges of the first and second sub bumps BP_1 and BP_2 in the first direction X in a plan view, an electric field may be uniformly applied to corner regions of the first sub bump BP_1 and the second sub bump BP_2.

Although not shown, the lead electrode LE of the printed circuit board 300 may include a first sub lead electrode LE1 and a second sub lead electrode LE2 similar to the first sub bump BP_1 and the second sub bump BP_2, respectively. The first sub lead electrode LE1 and the second sub lead electrode LE2 are separated from each other in a plan view and are electrically connected to each other through the inside of the printed circuit board 300, and the alignment electrode AE may be interposed therebetween. Likewise, the pad electrode PE of the display panel 100 may include a first sub pad electrode PE1 and a second sub pad electrode PE2. The first sub pad electrode PE1 and the second sub pad electrode PE2 are separated from each other in a plan view and are electrically connected to each other through the inside of the display panel 100, and the alignment electrode AE may be interposed therebetween.

Since the embodiment in FIGS. 11 and 12 is substantially the same as or similar to the embodiment in FIGS. 7 and 8 except for the shapes of the bump BP and the alignment electrode AE, overlapping descriptions will be omitted.

Figure 13:
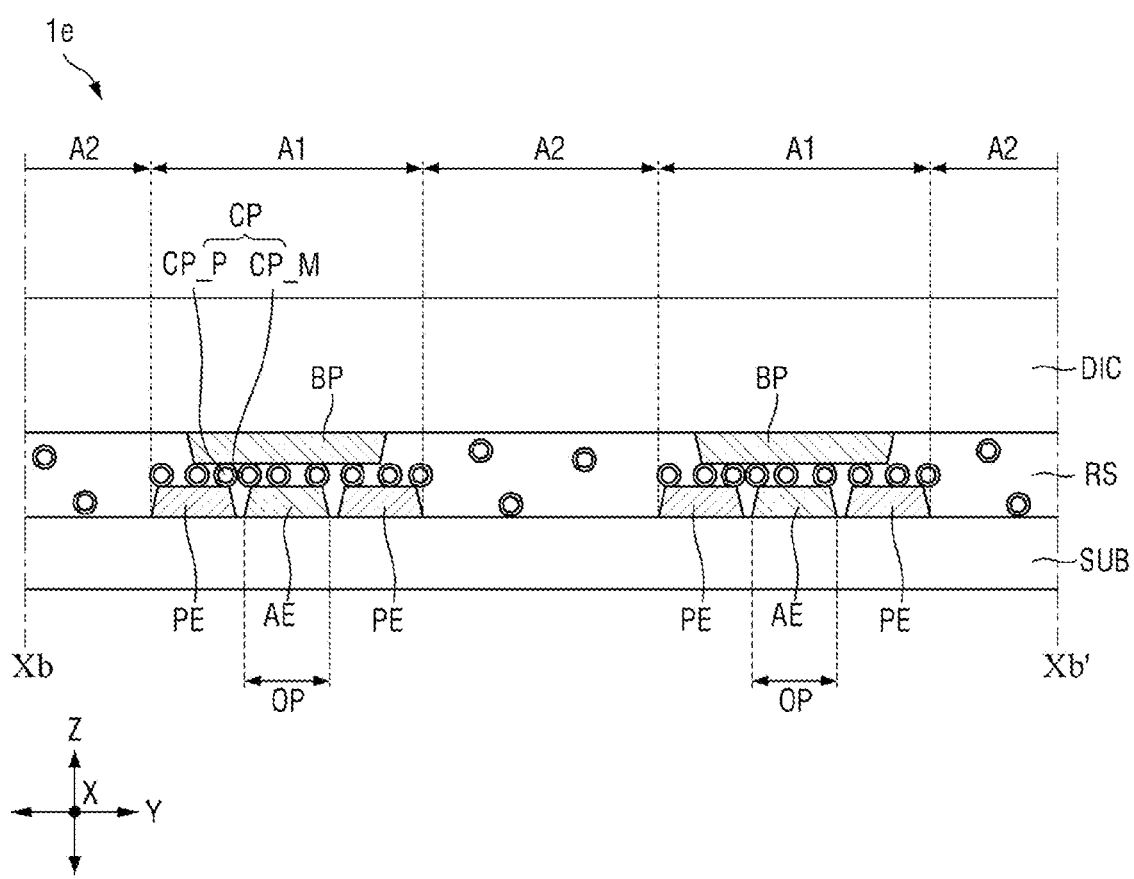
FIG. 13 is a cross-sectional view of another embodiment of a display device.

FIG. 13 is a cross-sectional view of another embodiment of a display device.

Referring to FIG. 13, in the display device 1e, a plurality of alignment electrodes AE may be disposed on substrate SUB of a display panel 100.

An opening OP and the alignment electrode AE may be disposed on a pad electrode PE in a method substantially the same as or similar to the embodiment in FIGS. 7 and 8. That is, like the plurality of bumps BP shown in FIGS. 7 and 8, the opening OP may be defined in each of the plurality of pad electrodes PE, and the alignment electrode AE may be disposed in the opening OP.

Referring further to FIG. 4, the plurality of pad electrodes PE may each have an approximately quadrangular (e.g., rectangular) shape in a plan view. In this case, at least one opening OP and at least one alignment electrode AE may be disposed in each pad electrode PE to form an island-shaped pattern as shown in FIGS. 8, 9, and 10 in a plan view, or as shown in FIG. 12, may be disposed between the sub bumps BP_1 and BP_2 to form a stripe pattern.

Although not shown, the opening OP and the alignment electrode AE may also be disposed in the driving member 200. That is, the opening OP and the alignment electrode AE may be disposed on both the bump BP and the pad electrode PE.

Since the embodiment in FIG. 13 is substantially the same as or similar to the embodiment in FIGS. 1 to 6 except for the arrangement of the alignment electrodes AE, overlapping descriptions will be omitted.

Figure 14:
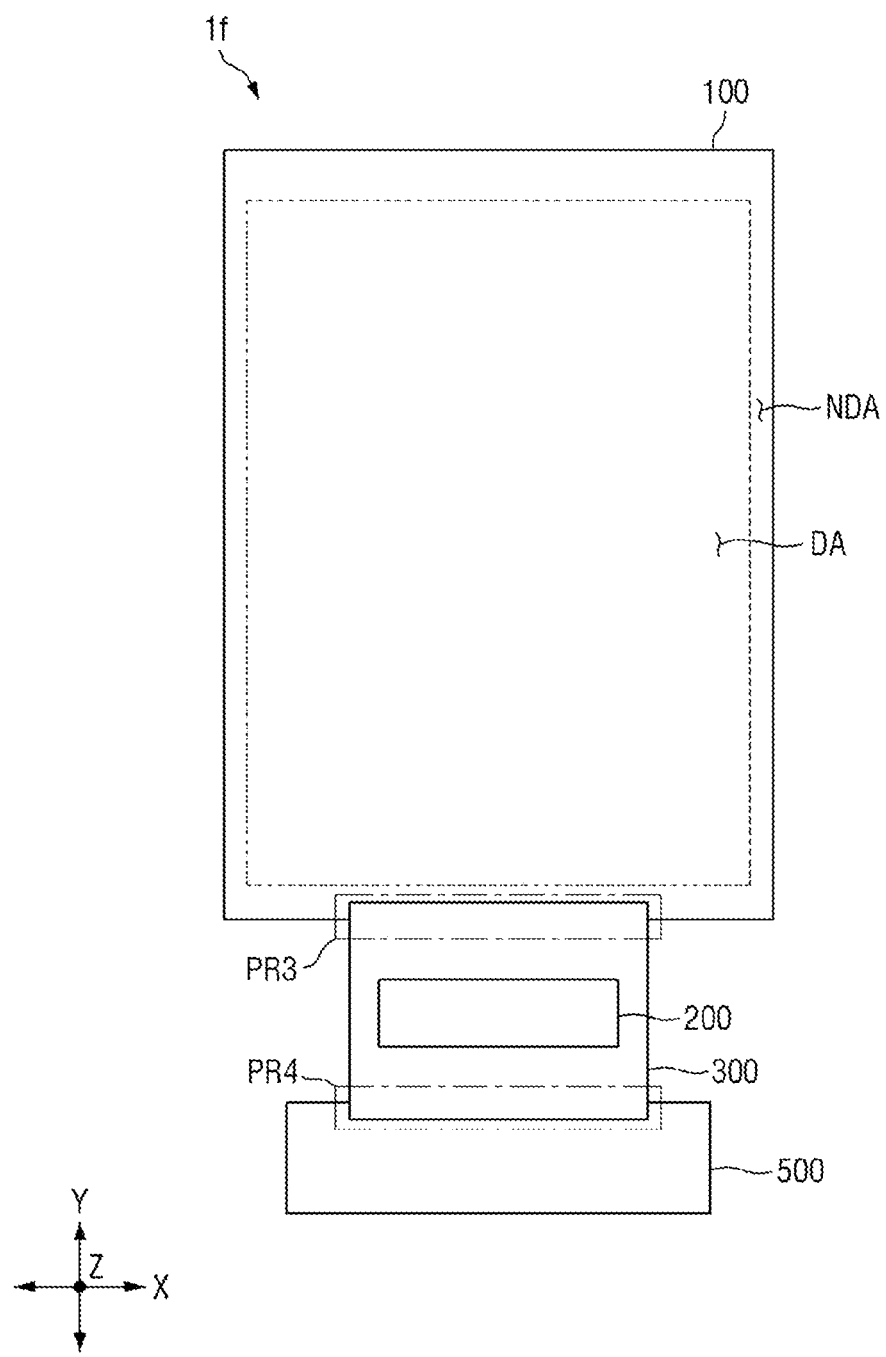
FIG. 14 is a plan view of another embodiment of a display device.

FIG. 14 is a plan view of another embodiment of a display device.

Referring to FIG. 14, the driving member 200 may be disposed in a chip on film method.

Specifically, a display device 1f may include a display panel 100, a printed circuit board 300, and a main circuit board 500.

The display panel 100 may be substantially the same as or similar to the display panel 100 in FIGS. 1 to 6.

The printed circuit board 300 may be connected to a non-display region NDA of the display panel 100. In an embodiment, the printed circuit board 300 may be a thin flexible circuit film, for example.

One side of the printed circuit board 300 may be connected to the display panel 100, and the other side of the printed circuit board 300 may be connected to the main circuit board 500. In an embodiment, as shown in FIG. 14, in a plan view, an upper side of the printed circuit board 300 may be attached to a lower short side of the display panel 100, and a lower side of the printed circuit board 300 may be attached to an upper side of the main circuit board 500, for example. However, the invention is not limited thereto, and the printed circuit board 300 may be attached to an upper short side, a left long side, or a right long side of the display panel 100.

The driving member 200 may be disposed on the printed circuit board 300. The driving member 200 may be disposed (e.g., mounted) on the printed circuit board 300 by a chip on film method.

The main circuit board 500 is connected to the printed circuit board 300. In an embodiment, as shown in FIG. 1, in a plan view, the upper side of the main circuit board 500 may be connected to the lower side of the printed circuit board 300, for example.

The display device 1f may include a third connection region PR3 and a fourth connection region PR4. The third connection region PR3 may be a region where the printed circuit board 300 and the display panel 100 overlap each other to be electrically connected, and the fourth connection region PR4 may be a region where the printed circuit board 300 and the main circuit board 500 overlap each other to be electrically connected.

Referring further to FIGS. 1 to 6, third connection region PR3 and the fourth connection region PR4 may perform substantially the same or a similar function as the second connection region PR2.

The third connection region PR3 may have substantially the same structure as the second connection region PR2. In an embodiment, in the third connection region PR3, an adhesion member RS may be interposed between the printed circuit board 300 and the display panel 100, and a plurality of lead electrodes LE of the printed circuit board 300 and a plurality of pad electrodes PE of the substrate SUB of the display panel 100 may be electrically connected by conductive particles CP dispersed in the adhesion member RS, for example. Likewise, in the fourth connection region PR4, the printed circuit board 300 and the main circuit board 500 may be connected to each other in a method substantially the same as or similar to the method in which the printed circuit board 300 and the display panel 100 are connected.

Since the embodiment in FIG. 14 is substantially the same as or similar to the embodiment in FIGS. 1 to 6 except for a method of mounting the driving member 200, overlapping descriptions will be omitted.

Figure 15:
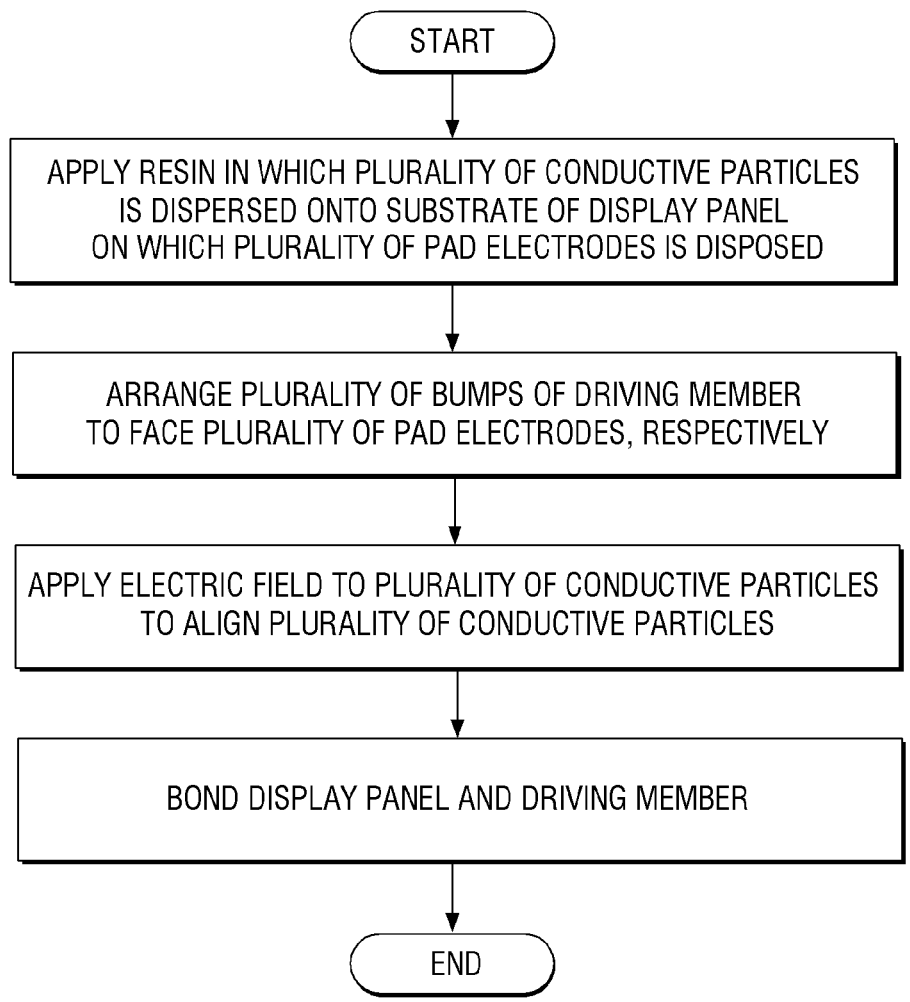
FIG. 15 is a flow chart of an embodiment of a method of manufacturing the display device.

FIG. 15 is a flow chart of an embodiment of a method of manufacturing the display device. FIGS. 16 to 20 are views illustrating an embodiment of operations of the method of manufacturing the display device.

Referring to FIG. 15, the method of manufacturing the display device in an embodiment may include applying a resin in which a plurality of conductive particles CP is dispersed onto a substrate SUB of a display panel 100 on which a plurality of pad electrodes PE is disposed, arranging a plurality of bumps BP of a driving member 200 to respectively face the plurality of pad electrodes PE, applying an electric field to the plurality of conductive particles CP to align the plurality of conductive particles CP, and bonding the display panel 100 and the driving member 200.

The aligning of the plurality of conductive particles may include at least one of applying a voltage to an alignment electrode AE disposed in an opening OP defined in the bump BP and the plurality of pad electrodes PE to generate an electric field for aligning the plurality of conductive particles CP and applying a voltage to the alignment electrode AE disposed in the opening OP defined in the pad electrode PE and the plurality of bumps BP.

However, the method of manufacturing the display device is not limited to the example, and at least one of the operations may be omitted, or at least one other operation may be further included with reference to another description of the specification.

Hereinafter, the method of manufacturing the display device will be described in detail with reference to FIGS. 16 to 20.

Figure 16:
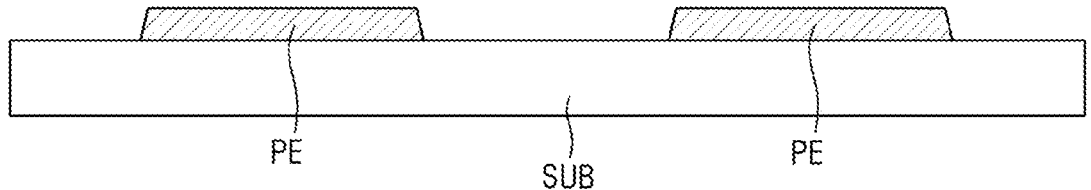
FIGS. 16 to 20 are views illustrating an embodiment of operations of the method of manufacturing the display device.

Referring to FIG. 16, the substrate SUB on which the plurality of pad electrodes PE is disposed may be prepared. The plurality of pad electrodes PE may be disposed on one surface of the substrate SUB to be spaced apart from each other.

Figure 17:
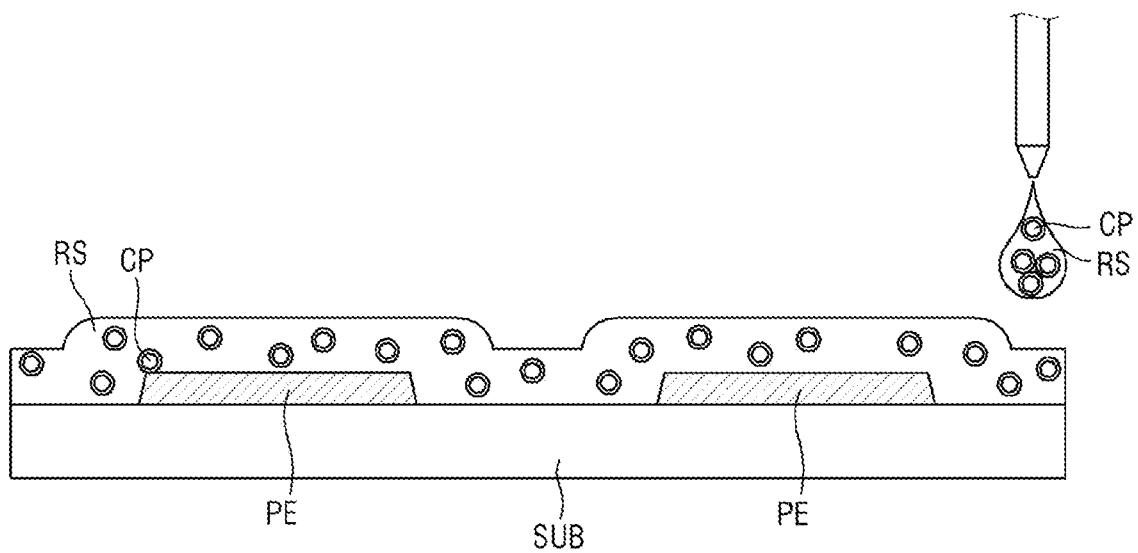

Referring to FIG. 17, an adhesion member RS may be applied on the one surface of the substrate SUB. The adhesion member RS may be a resin in which the plurality of conductive particles CP is dispersed. As described above, the resin may include a thermosetting resin, a thermoplastic resin, and an ultraviolet curing resin.

When the adhesion member RS is applied, the plurality of conductive particles CP may be relatively uniformly distributed on one surface of the substrate SUB. Since the adhesion member RS has fluidity before being cured, the plurality of conductive particles CP may flow in the adhesion member RS.

Figure 18:
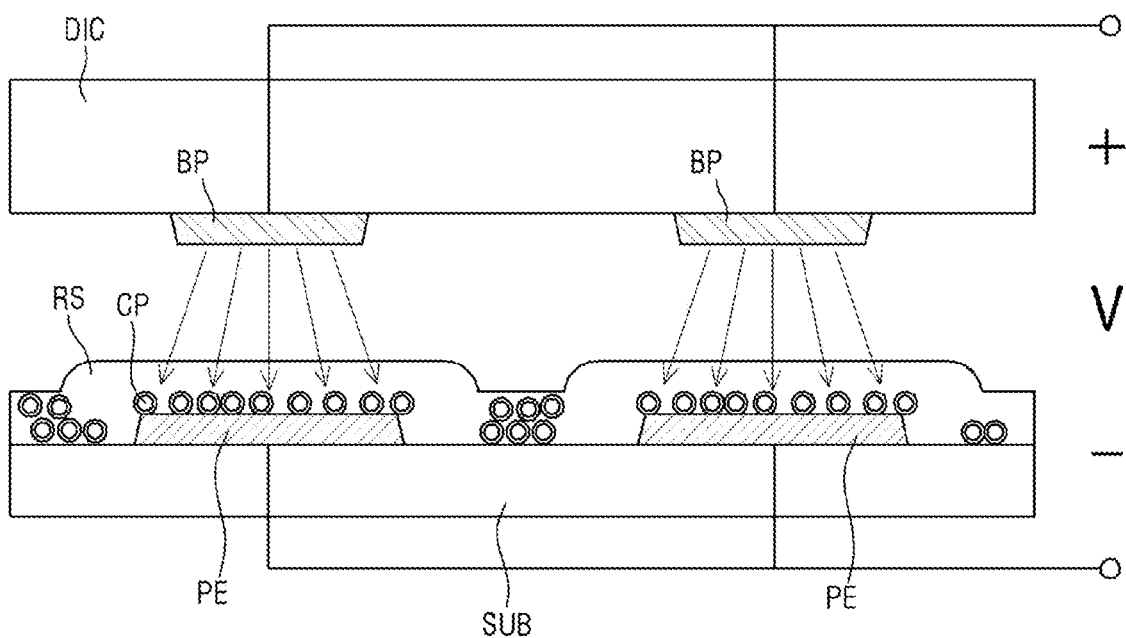

Referring to FIG. 18, after the adhesion member RS is applied, the driving member 200 including the plurality of bumps BP may be disposed on the substrate SUB. The plurality of bumps BP may be arranged to respectively face the plurality of pad electrodes PE. The plurality of bumps BP may be arranged to respectively overlap the plurality of pad electrodes PE in the thickness direction. In this case, a plurality of pads may be spaced apart from the adhesion member RS and the conductive particles CP at a predetermined interval.

After the arrangement of the driving member 200 is completed, a voltage may be applied to each of the bump BP and the pad electrode PE. In an embodiment, a positive voltage may be applied to the bump BP and a negative voltage may be applied to the pad electrode PE, for example.

However, a reference numeral of the voltage applied to the bump BP and the pad electrode PE is not limited to the embodiment of FIG. 18.

When the voltages are applied to the bump BP and the pad electrode PE, an electric field may be generated between the bump BP and the pad electrode PE facing each other. In this case, as described above in FIGS. 5A and 5B, since the plurality of conductive particles CP includes a metal coating layer CP_M, the plurality of conductive particles CP may be polarized by the electric field and may be aligned between the bump BP and the pad electrode PE. Since the plurality of conductive particles CP between the pad electrodes PE moves toward adjacent pad electrode PE, a density of the conductive particles CP disposed between the plurality of pad electrodes PE may be smaller than a density of the conductive particles CP disposed on the plurality of pad electrodes PE. The conductive particles CP may not be provided between the plurality of pad electrodes PE depending on intensity of the applied electric field, a distance between the pad electrodes PE, and the like.

Figure 19:
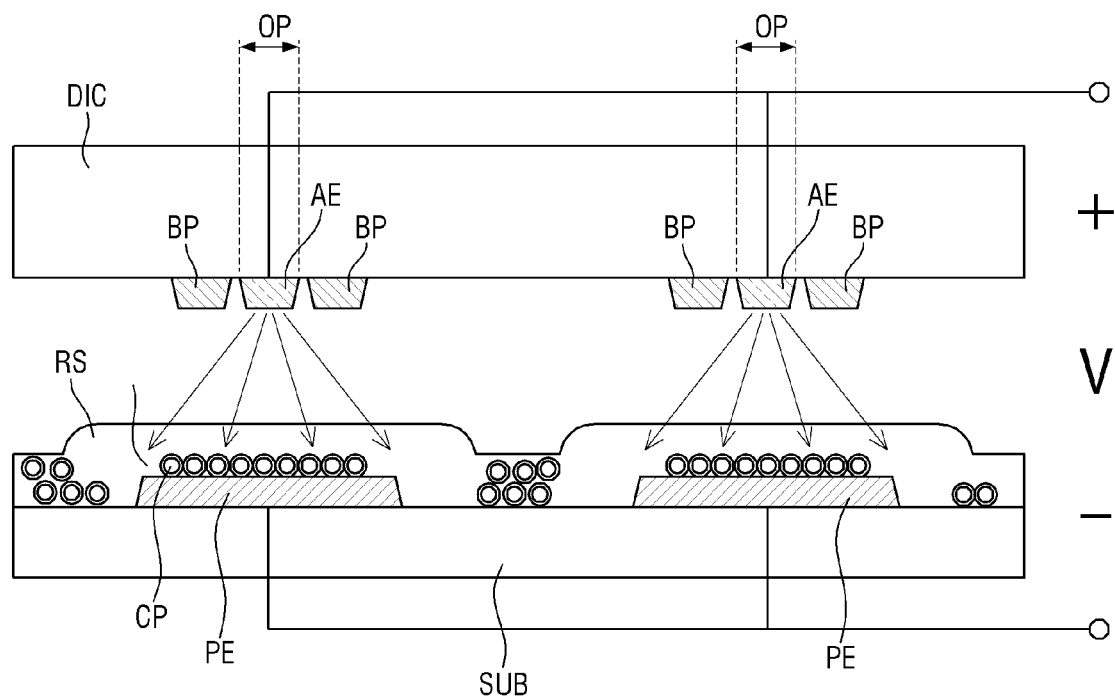

Referring to FIG. 19, when the alignment electrode AE is provided to the driving member 200, a voltage may be applied to the alignment electrode AE rather than the bump BP. In this case, since the bump BP is electrically separated from the alignment electrode AE, the voltage may not be applied to the bump BP.

The alignment electrode AE has a relatively smaller area than the pad electrode PE and/or the bump BP, and thus may function as a point source to which an electric force line is concentrated. In this case, compared to a case in which the alignment electrode AE is not disposed, since the plurality of conductive particles CP may move to be further concentrated toward the alignment electrode AE and an adjacent region, for example, a center of the pad electrode PE in a cross section, corresponding to a shape of the concentrated electric force line, the plurality of conductive particles CP may be more efficiently aligned.

The alignment electrode AE and the bump BP are not limited to the embodiment in FIG. 19, and as in the embodiment in FIG. 11, a voltage may be applied to the alignment electrode AE provided between the first sub bump BP_1 and the second sub bump BP_2. In an alternative embodiment, as in the embodiment in FIG. 13, the alignment electrode AE may be provided in the opening OP of the pad electrode PE of the display panel 100.

Figure 20:
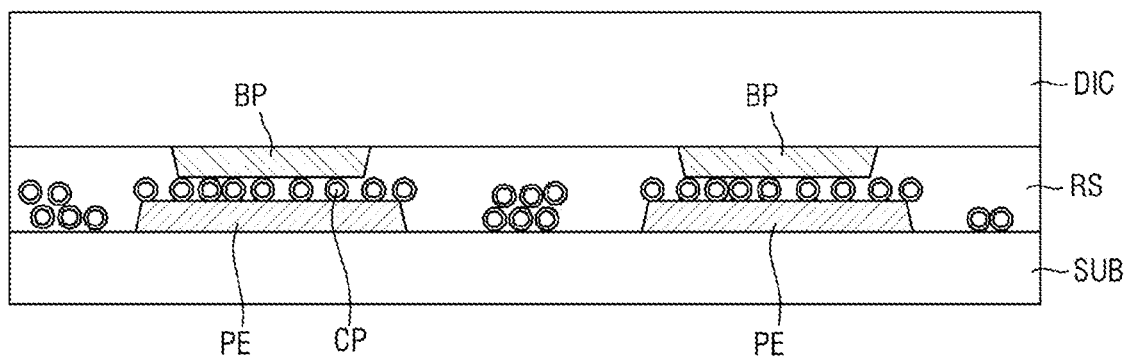

Referring to FIG. 20, after the aligning of the conductive particles CP is completed, the driving member 200 may come into close contact with the display panel 100. In this case, the adhesion member RS may be cured by heating, ultraviolet light exposure, or the like. In an embodiment, when the adhesion member RS is a thermosetting resin, the driving member 200 may be thermally compressed to the display panel 100, for example, but the invention is not limited thereto.

Figure 21:
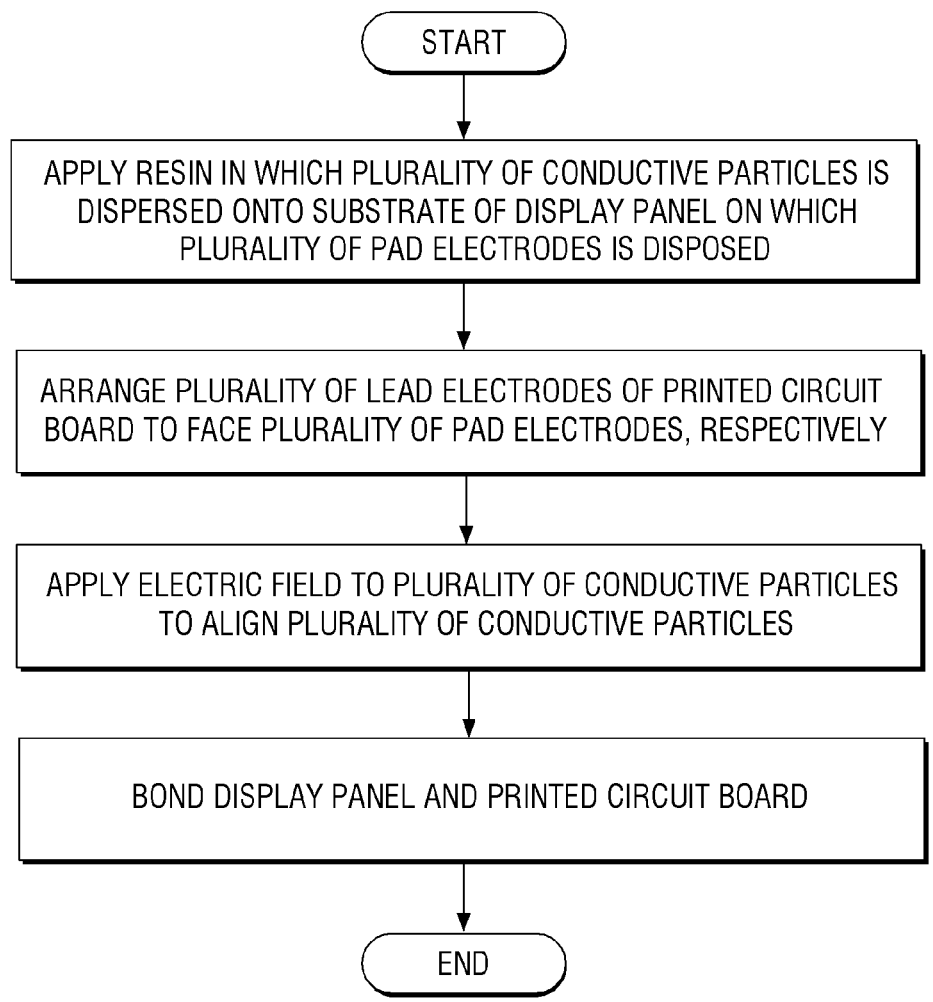
FIG. 21 is a flow chart of another embodiment of a method of manufacturing the display device.
Figure 22:
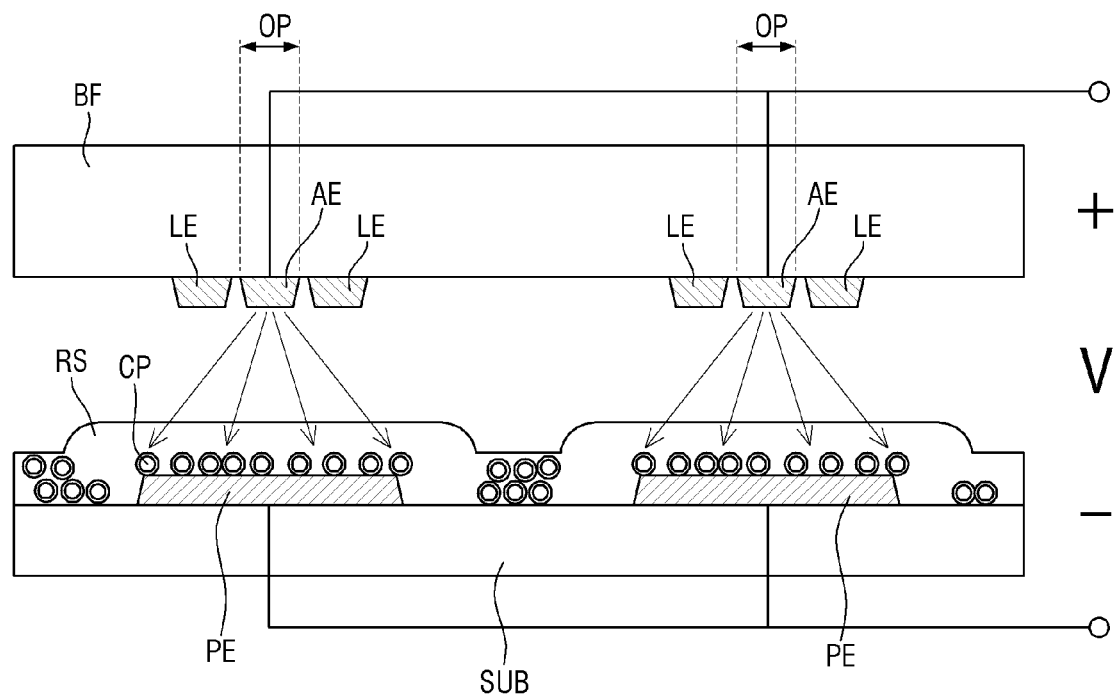
FIG. 22 is a view illustrating another embodiment of an operation of the method of manufacturing the display device.

FIG. 21 is a flow chart of another embodiment of a method of manufacturing a display device. FIG. 22 is a view illustrating another embodiment of an operation of the method of manufacturing the display device.

Referring to FIG. 21, the method of manufacturing the display device in another embodiment may include applying a resin in which a plurality of conductive particles CP is dispersed onto a substrate SUB of a display panel 100 on which a plurality of pad electrodes PE is disposed, arranging a plurality of lead electrodes LE of a printed circuit board 300 to respectively face the plurality of pad electrodes PE, applying an electric field to the plurality of conductive particles CP to align the plurality of conductive particles CP, and bonding the display panel 100 and the printed circuit board 300.

The aligning of the plurality of conductive particles may include at least one of applying a voltage to an alignment electrode AE disposed in an opening OP defined in the lead electrode LE and the plurality of pad electrodes PE to generate an electric field for aligning the plurality of conductive particles CP and applying a voltage to the alignment electrode AE disposed in the opening OP defined in the pad electrode PE and the plurality of lead electrodes LE.

However, the method of manufacturing the display device is not limited to the example, and at least one of the operations may be omitted, or at least one other operation may be further included with reference to another description of the specification.

Referring to FIGS. 15 to 22, the bonding of the printed circuit board 300 and the display panel 100 may be performed in a method substantially the same as or similar to the bonding of the driving member 200 and the display panel 100. In an embodiment, similar to that shown in FIGS. 16 and 17, the substrate SUB of the display panel 100 may be prepared and the adhesion member RS in which the plurality of conductive particles CP is dispersed may be applied to one surface of the substrate SUB on which the pad electrodes PE is disposed, for example.

Hereinafter, an electric field for aligning the plurality of conductive particles CP may be applied.

For example, as shown in FIG. 22, the voltage is applied to the alignment electrode AE and the pad electrode PE disposed in the opening OP of the lead electrode LE, and thus the plurality of conductive particles CP may be aligned on the pad electrode PE. In another embodiment, although not shown, the opening OP and the alignment electrode AE may be omitted, and the voltage may be applied to the lead electrode LE and the pad electrode PE. As still another example, as shown in FIG. 13, the alignment electrode AE may be disposed in the opening OP of the pad electrode PE, and the voltage may be applied to the alignment electrode AE and the lead electrode LE.

After the aligning of the plurality of conductive particles CP is completed, similar to FIG. 20, the printed circuit board 300 and the substrate SUB of the display panel 100 may be bonded to each other.

Display devices according to various embodiments and methods of manufacturing the display devices may prevent a connection failure due to a flow of conductive particles.

Effects in embodiments are not limited to the above, and more various effects are included in the specification.

In concluding the detailed description, those skilled in the art will appreciate that many variations and modifications may be made to the preferred embodiments without substantially departing from the principles of the invention. Therefore, the disclosed preferred embodiments of the invention are used in a generic and descriptive sense only and not for purposes of limitation.

What is claimed is:

1. A display device comprising:
a display panel including a plurality of pad electrodes;
a driving member attached to the display panel and including a plurality of bumps facing the plurality of pad electrodes, respectively;
a plurality of conductive particles interposed between the display panel and the driving member; and
a plurality of alignment electrodes separated from the plurality of pad electrodes and the plurality of bumps,
wherein an opening is defined in pad electrodes immediately next to each other among the plurality of pad electrodes or bumps immediately next to each other among the plurality of bumps,
an alignment electrode of the plurality of alignment electrodes is disposed in the opening, and
the alignment electrode and the pad electrodes overlap a bump of the plurality of bumps or the alignment electrode and the bumps overlap a pad electrode of the plurality of pad electrodes.

2. The display device of claim 1, wherein a density of the plurality of conductive particles in a first adhesion region where the plurality of pad electrodes and the plurality of bumps overlap in a thickness direction is greater than a density in a second adhesion region where the plurality of pad electrodes and the plurality of bumps do not overlap in the thickness direction.

3. The display device of claim 2, wherein the plurality of conductive particles is disposed only in the first adhesion region.

4. The display device of claim 1, wherein:
an opening is defined in the pad electrode; and
the alignment electrode is disposed in the opening of the pad electrode and spaced apart from the pad electrode.

5. The display device of claim 1, wherein:
an opening is defined in the bump; and
the alignment electrode is disposed in the opening of the bump and spaced apart from the bump.

6. The display device of claim 1, wherein:
the plurality of pad electrodes and the plurality of bumps are arranged in a first direction; and
each of the opening and the alignment electrode has an elongated shape in a plan view in a second direction which intersects the first direction.

7. The display device of claim 1, wherein each of the opening and the alignment electrode is disposed in plural in at least one of the pad electrode and the bump.

8. The display device of claim 1, wherein the opening and the alignment electrode are disposed in a center of the pad electrode or a center of the bump in a plan view.

9. A display device comprising:
a display panel including a plurality of pad electrodes;
a printed circuit board attached to the display panel and including a plurality of lead electrodes facing the plurality of pad electrodes, respectively;
a plurality of conductive particles interposed between the display panel and the printed circuit board; and
a plurality of alignment electrodes separated from the plurality of pad electrodes and the plurality of lead electrodes,
wherein an opening is defined in pad electrodes immediately next to each other among the plurality of pad electrodes or lead electrodes immediately next to each other among the plurality of lead electrodes,
an alignment electrode of the plurality of alignment electrodes is disposed in the opening, and
the alignment electrode and the pad electrodes overlap a lead electrode of the plurality of lead electrodes or the alignment electrode and the lead electrodes overlap a pad electrode of the plurality of pad electrodes.

10. The display device of claim 9, wherein a density of the plurality of conductive particles in a first adhesion region where the plurality of pad electrodes and the lead electrodes overlap in a thickness direction is greater than a density in a second adhesion region where the plurality of pad electrodes and the lead electrodes do not overlap in the thickness direction.

11. The display device of claim 10, wherein the plurality of conductive particles is disposed only in the first adhesion region.

12. The display device of claim 9, wherein:
the pad electrode includes an opening; and
the alignment electrode is disposed in the opening of the pad electrode and spaced apart from the pad electrode.

13. The display device of claim 9, wherein:
the lead electrode includes an opening; and
the alignment electrode is disposed in the opening of the lead electrode and spaced apart from the lead electrode.

14. The display device of claim 9, wherein:
the plurality of pad electrodes and the plurality of lead electrodes are arranged in a first direction; and
each of the opening and the alignment electrode has an elongated shape in a plan view in a second direction which intersects the first direction.

15. The display device of claim 9, wherein each of the opening and the alignment electrode is disposed in plural in at least one of the pad electrode and the lead electrode.

16. The display device of claim 9, wherein the opening and the alignment electrode are disposed in a center of the pad electrode or a center of the lead electrode in a plan view.

17. An electronic device comprising:
a display device comprising:
a display panel including a plurality of pad electrodes;
a driving member attached to the display panel and including a plurality of bumps facing the plurality of pad electrodes, respectively;
a plurality of conductive particles interposed between the display panel and the driving member; and
a plurality of alignment electrodes separated from the plurality of pad electrodes and the plurality of bumps,
wherein an opening is defined in pad electrodes immediately next to each other among the plurality of pad electrodes or bumps immediately next to each other among the plurality of bumps,
an alignment electrode of the plurality of alignment electrodes is disposed in the opening, and
the alignment electrode and the pad electrodes overlap a bump of the plurality of bumps or the alignment electrode and the bumps overlap a pad electrode of the plurality of pad electrodes.

18. The electronic device of claim 17, wherein a density of the plurality of conductive particles in a first adhesion region where the plurality of pad electrodes and the plurality of bumps overlap in a thickness direction is greater than a density in a second adhesion region where the plurality of pad electrodes and the plurality of bumps do not overlap in the thickness direction.

19. The electronic device of claim 18, wherein the plurality of conductive particles is disposed only in the first adhesion region.

20. The electronic device of claim 17, wherein:
an opening is defined in the pad electrode; and
the alignment electrode is disposed in the opening of the pad electrode and spaced apart from the pad electrode.

* * * * *